(12) United States Patent
Nagai

(10) Patent No.: US 8,921,125 B2
(45) Date of Patent: Dec. 30, 2014

(54) METHOD OF MAKING FERROELECTRIC MEMORY DEVICE WITH BARRIER LAYER AND NOVOLAC RESIN PASSIVATION LAYER

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 277 days.

(21) Appl. No.: 13/442,217

(22) Filed: Apr. 9, 2012

(65) Prior Publication Data

US 2012/0195114 A1     Aug. 2, 2012

Related U.S. Application Data

(60) Division of application No. 12/503,357, filed on Jul. 15, 2009, now Pat. No. 8,582,343, which is a continuation of application No. PCT/JP2007/053666, filed on Feb. 27, 2007.

(51) Int. Cl.

| | |
|---|---|
| *H01L 21/00* | (2006.01) |
| *H01L 27/105* | (2006.01) |
| *H01L 21/768* | (2006.01) |
| *H01L 27/115* | (2006.01) |
| *H01L 49/02* | (2006.01) |
| *H01L 23/00* | (2006.01) |
| *H01L 23/31* | (2006.01) |

(52) U.S. Cl.
CPC ..... *H01L 23/564* (2013.01); *H01L 2924/01077* (2013.01); *H01L 2924/01014* (2013.01); *H01L 2924/01012* (2013.01); *H01L 2924/19041* (2013.01); *H01L 2924/01004* (2013.01); *H01L 2924/01029* (2013.01); *H01L 27/105* (2013.01);
(Continued)

(58) Field of Classification Search
USPC .......................................................... 438/3
See application file for complete search history.

(56) References Cited

U.S. PATENT DOCUMENTS

| 6,399,410 B1 | 6/2002 | Iwata et al. |
| 6,509,593 B2 | 1/2003 | Inoue et al. |

(Continued)

FOREIGN PATENT DOCUMENTS

| CN | 1627522 A | 6/2005 |
| JP | 63-208228 A | 8/1988 |

(Continued)

OTHER PUBLICATIONS

Translation of JP 2005/06764 retrieved on Apr. 30, 2014.*

(Continued)

*Primary Examiner* — Yu-Hsi D Sun
*Assistant Examiner* — Grant Withers
(74) *Attorney, Agent, or Firm* — Westerman, Hattori, Daniels & Adrian, LLP

(57) ABSTRACT

A ferroelectric capacitor comprising a transistor layer superimposed on a semiconductor substrate, a ferroelectric capacitor layer provided superior to the transistor layer, a wiring layer provided superior to the ferroelectric capacitor layer, and a passivation film. Further, at least one layer of barrier film capable of inhibiting penetration of moisture and hydrogen into the underlayer is provided between the ferroelectric capacitor layer and the passivation film, and the passivation film is characterized by containing a novolac resin.

5 Claims, 33 Drawing Sheets

(52) U.S. Cl.
CPC ....... *H01L 2924/01018* (2013.01); *H01L 24/13* (2013.01); *H01L 2924/01074* (2013.01); H01L 21/76826 (2013.01); H01L 27/11509 (2013.01); *H01L 2924/01046* (2013.01); H01L 27/11507 (2013.01); *H01L 2924/01005* (2013.01); *H01L 2924/01006* (2013.01); *H01L 2924/01078* (2013.01); H01L 24/05 (2013.01); *H01L 2924/0104* (2013.01); H01L 21/76832 (2013.01); *H01L 2924/01022* (2013.01); *H01L 2924/19043* (2013.01); *H01L 2224/0401* (2013.01); *H01L 2224/13144* (2013.01); *H01L 2924/01079* (2013.01); H01L 27/11502 (2013.01); *H01L 2924/01073* (2013.01); *H01L 2924/01033* (2013.01); *H01L 23/3192* (2013.01); H01L 28/55 (2013.01); *H01L 2224/05558* (2013.01); *H01L 2224/16* (2013.01); *H01L 2224/05572* (2013.01); *H01L 2924/01057* (2013.01); *H01L 2224/05554* (2013.01); *H01L 2924/01082* (2013.01); *H01L 2924/01013* (2013.01); *H01L 2224/13022* (2013.01); *H01L 2924/0105* (2013.01); H01L 24/03 (2013.01); *H01L 2924/00014* (2013.01); *H01L 2924/01023* (2013.01); *H01L 2224/05599* (2013.01); *H01L 2924/01041* (2013.01)
USPC .......................................................... 438/3

(56) References Cited

U.S. PATENT DOCUMENTS

| | | | | |
|---|---|---|---|---|
| 6,627,462 | B1* | 9/2003 | Yang et al. | 438/3 |
| 7,338,815 | B2* | 3/2008 | Hikosaka et al. | 438/3 |
| 7,791,066 | B2* | 9/2010 | Yamazaki | 257/40 |
| 7,892,916 | B2* | 2/2011 | Takamatsu et al. | 438/239 |
| 2004/0023417 | A1* | 2/2004 | Cross | 438/3 |
| 2005/0127395 | A1 | 6/2005 | Saigoh et al. | |
| 2006/0102942 | A1 | 5/2006 | Takahashi | |
| 2006/0157772 | A1 | 7/2006 | Sumida et al. | |
| 2006/0223198 | A1* | 10/2006 | Kikuchi et al. | 438/3 |
| 2007/0020803 | A1 | 1/2007 | Saigoh et al. | |
| 2007/0196999 | A1 | 8/2007 | Tamura et al. | |
| 2008/0073685 | A1 | 3/2008 | Wang | |
| 2008/0105911 | A1* | 5/2008 | Wang | 257/295 |
| 2008/0111173 | A1* | 5/2008 | Wang | 257/295 |
| 2008/0142864 | A1 | 6/2008 | Takahashi et al. | |
| 2008/0203576 | A1* | 8/2008 | Kikuchi et al. | 257/773 |
| 2008/0258195 | A1* | 10/2008 | Sugawara et al. | 257/295 |
| 2008/0258262 | A1* | 10/2008 | Nagai | 257/535 |
| 2009/0302362 | A1* | 12/2009 | Kikuchi et al. | 257/295 |
| 2010/0001372 | A1* | 1/2010 | Miyazaki et al. | 257/532 |
| 2010/0009466 | A1* | 1/2010 | Nagai | 438/3 |
| 2010/0019348 | A1* | 1/2010 | Nagai | 257/532 |
| 2010/0078693 | A1* | 4/2010 | Nakao | 257/295 |
| 2010/0087014 | A1 | 4/2010 | Nagai | |
| 2010/0105152 | A1* | 4/2010 | Wang | 438/3 |
| 2010/0144064 | A1* | 6/2010 | Saigoh et al. | 438/3 |
| 2010/0261296 | A1* | 10/2010 | Izumi | 438/3 |
| 2011/0079878 | A1* | 4/2011 | Aggarwal et al. | 257/532 |
| 2011/0165702 | A1* | 7/2011 | Wang | 438/3 |
| 2011/0183440 | A1* | 7/2011 | Matsuura | 438/3 |
| 2011/0210412 | A1* | 9/2011 | Yukawa et al. | 257/428 |
| 2011/0210424 | A1* | 9/2011 | Wang | 257/532 |
| 2011/0248291 | A1* | 10/2011 | Jinbo et al. | 257/88 |
| 2012/0028374 | A1* | 2/2012 | Kikuchi et al. | 438/3 |
| 2012/0032299 | A1* | 2/2012 | Wang | 257/532 |
| 2012/0056322 | A1* | 3/2012 | Saigoh et al. | 257/737 |
| 2012/0146185 | A1* | 6/2012 | Nagai | 257/532 |
| 2012/0220057 | A1* | 8/2012 | Wang | 438/3 |
| 2014/0017819 | A1* | 1/2014 | Sugawara et al. | 438/3 |

FOREIGN PATENT DOCUMENTS

| | | |
|---|---|---|
| JP | 3029316 B2 | 4/2000 |
| JP | 2004-140186 A | 5/2004 |
| JP | 2004-193400 A | 7/2004 |
| JP | 2004-296929 A | 10/2004 |
| JP | 2005-062764 A | 3/2005 |
| JP | 2005-183619 A | 7/2005 |
| JP | 2006-066906 A | 3/2006 |
| JP | 2006-147771 A | 6/2006 |
| JP | 2007-027514 A | 2/2007 |
| WO | 2006/129366 A1 | 12/2006 |
| WO | 2007/004295 A1 | 1/2007 |

OTHER PUBLICATIONS

Japanese Office Action dated Jun. 5, 2012, issued in corresponding Japanese Patent Application 2009-507280, w/English translation.
US Office Action dated Jul. 18, 2012, issued in corresponding U.S. Appl. No. 12/503,357.
US Office Action dated Mar. 7, 2013, issued in corresponding U.S. Appl. No. 12/503,357.
International Search Report of PCT/JP2007/053666, Mailing Date of May 15, 2007.
Notification of Transmittal of Translation of the International Preliminary Report on Patentability (Form PCT/IB/338) of International Application No. PCT/JP2007/05366 mailed Sep. 11, 2009 with Forms PCT/IB/373 and PCT/ISA/237.
Chinese Office Action dated May 11, 2010, issued in corresponding Chinese Patent Application No. 2007-80051751.4.

* cited by examiner

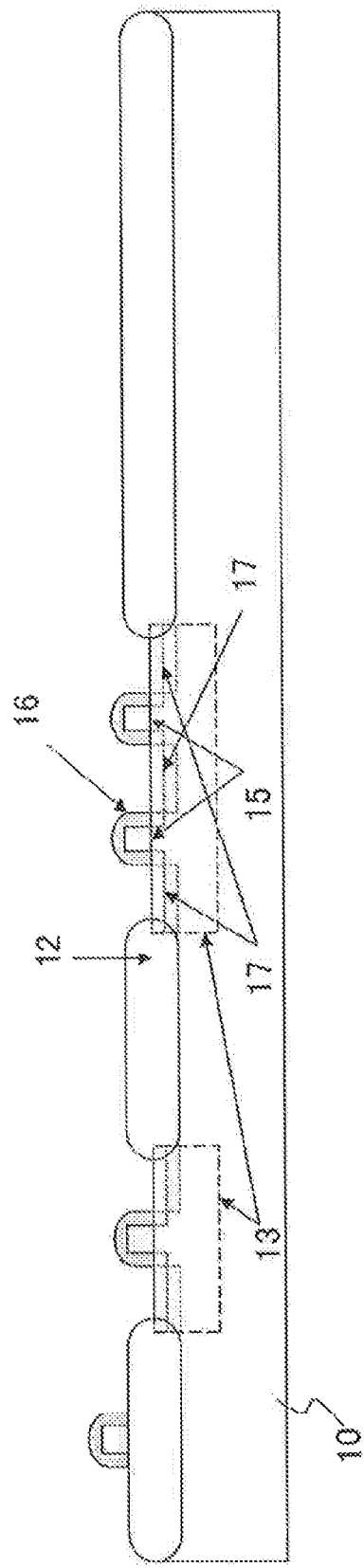

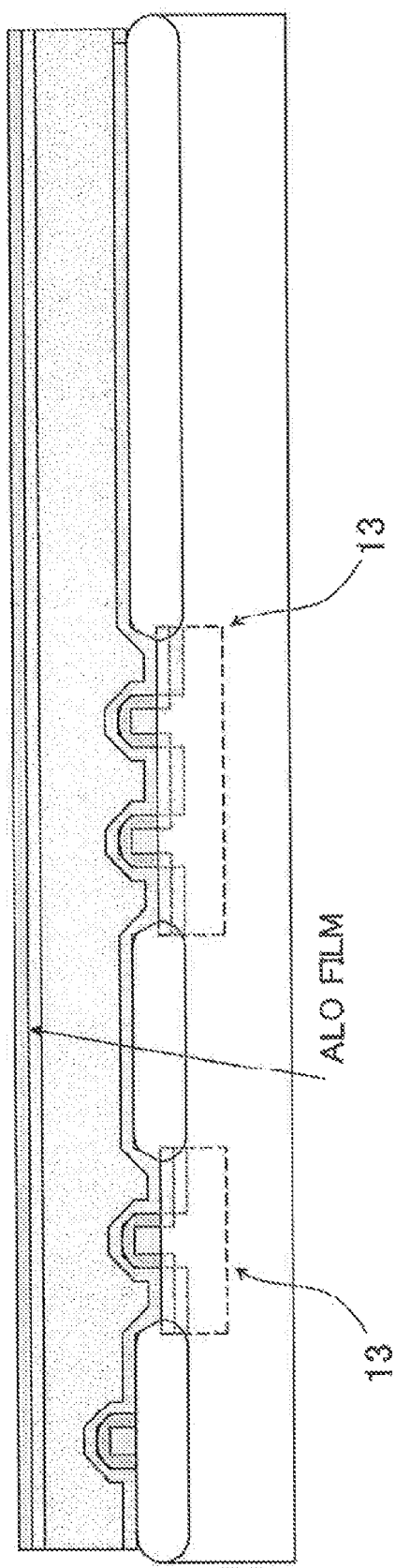

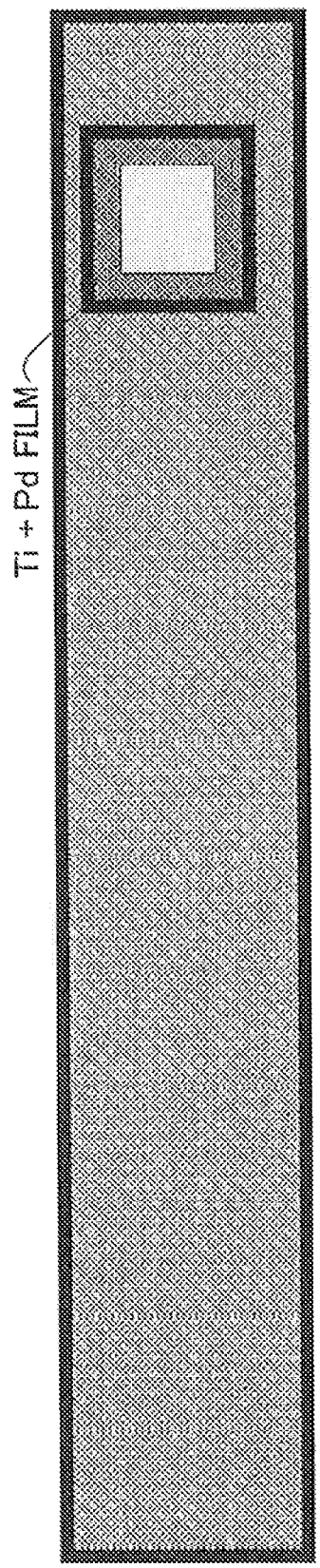

METHOD OF MAKING FERROELECTRIC MEMORY DEVICE WITH BARRIER LAYER AND NOVOLAC RESIN PASSIVATION LAYER

CROSS-REFERENCE TO RELATED APPLICATIONS

This Application is a divisional of U.S. application Ser. No. 12/503,357 filed Jul. 15, 2009, which is a continuation of application PCT/JP2007/053666, filed on Feb. 27, 2007, the contents of which are herein wholly incorporated by reference.

FIELD

The embodiments discussed herein are relates to a semiconductor storage device manufacturing method.

BACKGROUND

Over the recent years, a development has been accelerated of a ferroelectric memory (FeRAM) which retains information on a ferroelectric capacitor by utilizing polarizing inversion of a ferroelectric substance. The ferroelectric memory is a nonvolatile memory from which the retained information does not disappear even when switching off a power source, and is focused especially in terms of enabling high integration, high durability and low power consumption to be actualized.

A material of a ferroelectric film constituting the ferroelectric capacitor involves using mainly a ferroelectric oxide having a perosvkite crystalline structure such as a PZT(Pb(Zr,Ti)$O_3$) film and an SBT (SrBi$_2$Ta$_2$O$_9$) film on the order of 10µ-30 µC/cm$^2$, which has a large residual polarization quantity. It has hitherto been known that in this type of ferroelectric film, a characteristic of the ferroelectric substance is deteriorated due to a water content permeating from outside via an inter-layer insulating film such as a silicon oxide film having high affinity with the water. To be specific, the permeated water content is dissolved into hydrogen and oxygen in a high-temperature process when the inter-layer insulating film and a metal wiring layer are grown, resulting in the permeation into the ferroelectric film. Thereupon, the hydrogen reacts to the oxygen of the ferroelectric film, and an oxygen defect occurs in the ferroelectric film, with the result that crystallinity decreases. Further, a long-term use of the ferroelectric memory causes the same phenomenon. As a result, deterioration of performance of the ferroelectric capacitor arises such as decreases in residual polarization quantity and in dielectric constant of the ferroelectric film. Moreover, without being limited to the ferroelectric capacitor, the performance of a transistor etc might deteriorate.

To cope with such deterioration, aluminum oxide (Al$_2$O$_3$), which prevents the permeation of the hydrogen and the water content, has hitherto been employed. For example, the aluminum oxide is formed so as to embrace the ferroelectric capacitor and protects the ferroelectric capacitor so that the hydrogen/water content do not permeate an interior of the ferroelectric substance. Further, the aluminum oxide is formed upwardly of (just above) a first wiring and is utilized as a barrier film that prevents further permeation, into a lower layer, of the water and the hydrogen permeating from an upper portion of a semiconductor element. Herein, the first wiring represents a lowermost layer of wiring layers, which is, i.e., the wiring layer closest to a transistor or a layer of the ferroelectric capacitor.

Further, what is known about the ferroelectric capacitor is that the characteristic of the ferroelectric substance is deteriorated when high-temperature heat is applied thereto in a multi-layer process for a long period of time. The process of applying the high-temperature heat for the long time is exemplified by a process of forming polyimide becoming a final passivation film. This process has hitherto involved executing a treatment, e.g., at a temperature of 310° C.-350° C. for a period of baking time of 60 min. The characteristic of the ferroelectric substance, however, deteriorates because of being affected by the heat, the hydrogen and the water content generated when forming the polyimide. Therefore, such a scheme was proposed that a flat aluminum oxide film (aluminum film) is disposed between the uppermost wiring layer including a pad electrode and a wiring layer existing under this uppermost wiring layer. The aluminum film blocks the permeation of the hydrogen and further the water content generated from the polyimide into a semiconductor element.

[Patent document 1] Japanese Laid-open Patent Publication No. 2006-66906

[Patent document 2] Japanese Patent No. 3029316

SUMMARY

A semiconductor storage device including: a transistor layer formed on a semiconductor substrate; a ferroelectric capacitor layer formed upwardly of the transistor layer; a wiring layer formed upwardly of the ferroelectric capacitor layer; and a passivation film, wherein at least a mono-layered barrier film restraining a water content and hydrogen from permeating a lower layer is formed between the ferroelectric capacitor layer and the passivation film, and the passivation film contains a novolac resin. According to the present disclosure, at least a mono-layered barrier film restraining permeation of a water content and hydrogen into a lower layer is formed between the ferroelectric capacitor layer and the passivation film, and the passivation film includes a novolac resin.

The object and advantage of the embodiment will be realized and attained by means of the elements and combinations particularly pointed out in the claims.

It is to be understood that both the foregoing general description and the following detailed description are exemplary and explanatory only and are not restrictive of the invention, as claimed.

BRIEF DESCRIPTION OF THE DRAWINGS

FIG. 2A is a view illustrating a process of forming a transistor;

FIG. 2C is a view illustrating a process of forming an aluminum film;

FIG. 15A is a plan view illustrating a shape of the metal fill after being etched;

DESCRIPTION OF EMBODIMENTS

A ferroelectric memory (which will hereinafter be abbreviated to FeRAM) and a manufacturing method thereof according to an embodiment of the present disclosure will hereinafter be described with reference to the drawings. In this manufacturing method, when manufacturing an FeRAM device, a substitute for a polyimide passivation film is provided by forming a novolac resin in place of polyimide. The passivation film composed mainly of the novolac resin takes an advantage in terms of manufacturing the FeRAM because of advancement of bridging by a thermal treatment at a lower temperature (normally 200° C. through 230° C.) than by using the polyimide.

In the case of forming the passivation film by use of the novolac resin, however, it proves that the following problems arise. Basically, if set in a high-temperature state in an atmosphere of oxygen after forming the passivation film by use of the novolac resin, the problem is that resin-binding is disconnected. Another problem is that even if not in the atmosphere of oxygen, when applying heat so that the FeRAM reaches a much higher temperature equal to or higher than, e.g., 300° C., the resin-binding is disconnected.

(1) It proves that the passivation film composed mainly of the novolac resin is thereafter exposed to the atmosphere of oxygen, resulting in a decline of film strength.

(2) A retention test (for checking whether or not the data can be correctly recorded and read out) for a ferroelectric capacitor is conducted several times in the manufacturing process. On this occasion, a heat aging treatment serving as a load is carried out at 200° C. for 4 hours. At this time, the oxygen contained in the atmosphere affects the passivation film of the novolac resin so that this film gets deteriorated.

(3) After the test, the FeRAM device undergoes a dicing process, and diced chips are wrapped with a package resin on a chip-by-chip basis. On this occasion, when heating a die for the package, the film strength declines because of being exposed to the atmosphere.

As described above, when forming the passivation film by use of the novolac resin, the plurality of new problems arise, which leads to occurrence of a problem that long-term reliability decreases.

Such being the case, in order to solve the problems given above, it is an object to provide a structure, a manufacturing flow and manufacturing means that are capable of maintaining characteristics of the sufficient ferroelectric capacitor while employing the passivation film composed mainly of the novolac resin.

To be specific, the manufacturing method provides a structure of forming, in a semiconductor device including the ferroelectric capacitor and the passivation film formed upwardly on a wiring layer, a mono-layered flat hydrogen/water barrier film between above the ferroelectric capacitor and the passivation film, and having the passivation film composed of the novolac resin.

Figure 1A:
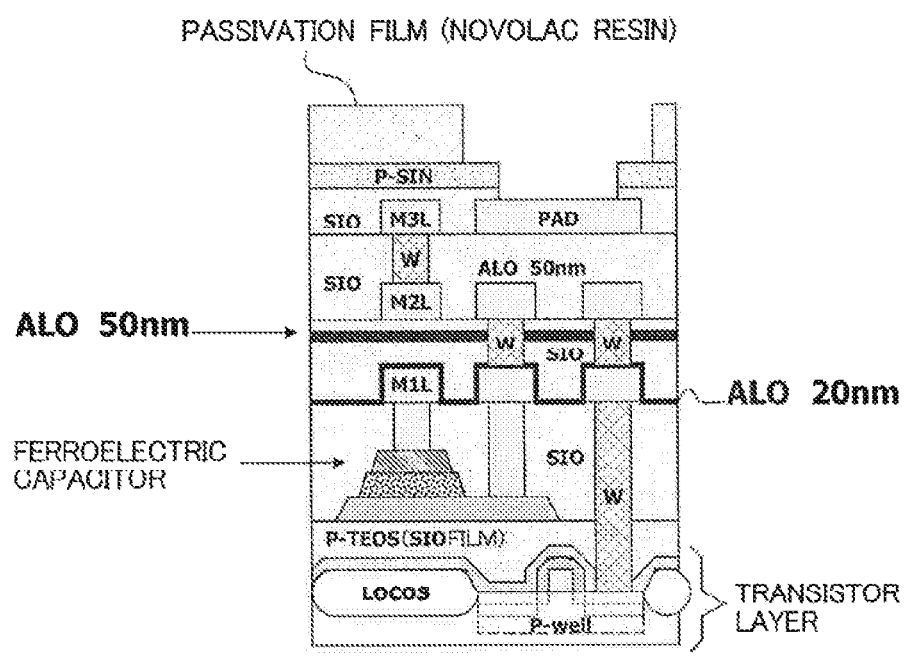
FIG. 1A is a view illustrating an outline of a structure of a ferroelectric memory manufactured in a process in an embodiment of the present disclosure.

FIG. 1A illustrates an outline of a structure of the FeRAM manufactured in this process. The FeRAM includes: a transistor layer having an element separation region, a well (exemplified as P-well in FIG. 1A), a source, a drain and a gate, which are formed in a LOCOS (LoCal Oxidation of Silicon) process; a ferroelectric capacitor on the transistor layer, wiring layers (M1L, M2L and M3L) above the ferroelectric capacitor; an aluminum film (depicted as ALO 20 nm in FIG. 1A) covering the lowermost wiring layer M1L; at least a mono-layered flat aluminum film (depicted by ALO 50 nm in FIG. 1A) formed on an inter-layer film SIO on the wiring layer M1L; a pad electrode (illustrated as PAD in FIG. 1A) formed flush with the uppermost wiring layer M3L; a nitride film (P-SIN) covering an upper layer of the wiring layer M3L; and a passivation film existing on the uppermost surface and covering the nitride film (P-SIN). Herein, the passivation film on the uppermost surface is composed of a resin of which a main component is the novolac resin. The novolac resin occupies 50% or more as a resin ratio, and the passivation film is subjected to a thermal treatment, in which a curing temperature is set equal to or lower than 200° C. and more preferably ranges from 170° C. up to 190° C.

Further, at least the mono-layered flat aluminum film functions as the hydrogen/water barrier film. The following is a reason why the hydrogen/water barrier film is formed. Namely, alcohol is generated during the thermal treatment of the novolac resin. The alcohol, though large of its molecular structure, permeates an interior of the semiconductor element. Moreover, when the alcohol is dissolved, the water content and the hydrogen occur. PZT (lead zirconate titanate) constituting the ferroelectric film is reduced by the hydrogen contained in the alcohol, the hydrogen in the water content, or the hydrogen generated when these elements are dissolved. Namely, a substance having hydrogen radicals exist in the periphery of the ferroelectric capacitor, and, when reaching a high temperature, the PZT reducing action is accelerated. Such being the case, at the minimum the mono-layered flat hydrogen/water barrier film is required for decreasing the reducing action. On the other hand, the novolac resin bridge-reacts to a low-temperature region, and hence, according to the process described above, a thermal damage is not exerted on the ferroelectric capacitor. Therefore, according to the present process, the thermal influence on the ferroelectric capacitor can be decreased after restraining the permeation of the alcohol, the water content, the hydrogen, etc.

Figure 1B:
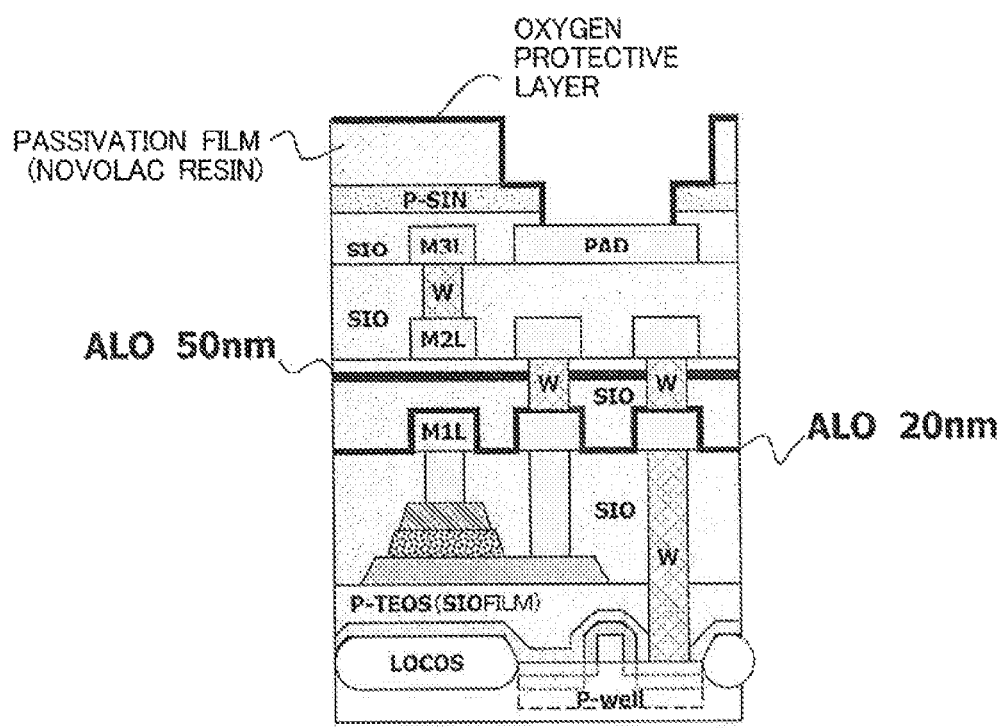
FIG. 1B is a view illustrating an outline of a structure of another ferroelectric memory manufactured in the process in the embodiment of the present disclosure.

FIG. 1B depicts another example of the FeRAM structure. In FIG. 1B, the passivation film on the uppermost surface is covered with an oxygen barrier film. This structure serves for the following purpose. Specifically, if the heat reaching a temperature equal to or higher than 100° C. is applied in the atmosphere where the oxygen exists, the resin-binding of the novolac resin is disconnected. Then, after forming the novolac resin, the oxygen barrier film is formed for preventing the novolac resin from being exposed to the atmosphere of oxygen.

Even in a state where the oxygen does not exist, however, when set in a state of 300° C., it proves that the resin-binding of the novolac resin is disconnected. In this case, a binding-breakdown due to the heat might happen at approximately 280° C. Therefore, desirably, after the passivation film has been formed from the novolac resin, the temperature is controlled so as not to reach 280° C. or higher.

The process executed so far enable the sufficient characteristics of the ferroelectric capacitor to be maintained in a way that uses the passivation film composed mainly of the novolac resin.

According to the present process, even when forming none of the excessive hydrogen/water barrier film, the decline of the characteristics of the ferroelectric substance can be restrained. Further, the passivation film can be formed in the low-temperature thermal treatment, and hence a failure in the retention is ameliorated by preventing the potential decline of the characteristics of the ferroelectric substance. Moreover, the newly-arisen problems are overcome by using the novolac resin for the passivation film, and the long-term reliability of the ferroelectric capacitor can be improved.

First Embodiment

Figure 17:
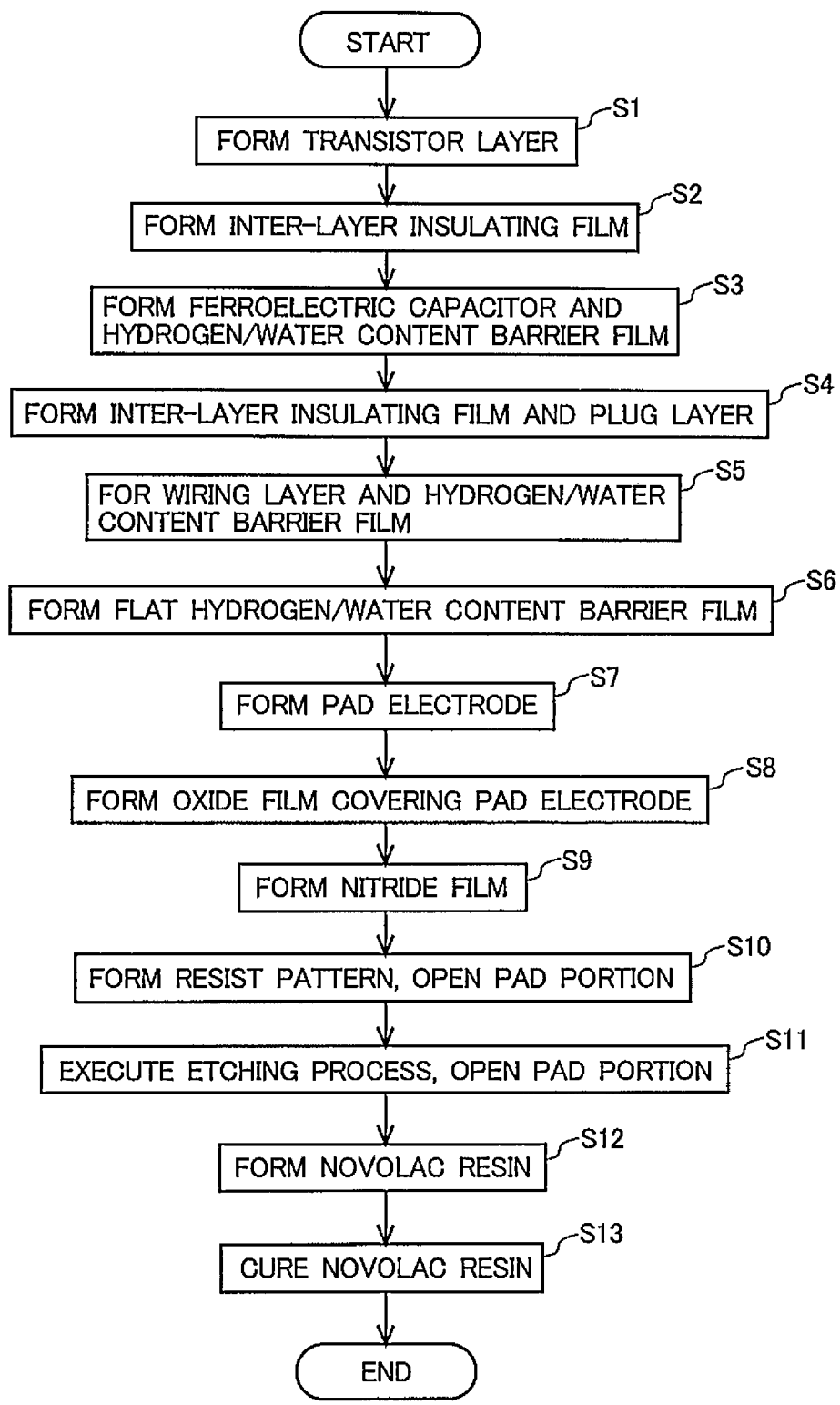
FIG. 17 is a view illustrating an outline of a ferroelectric memory manufacturing process.
Figure 18:
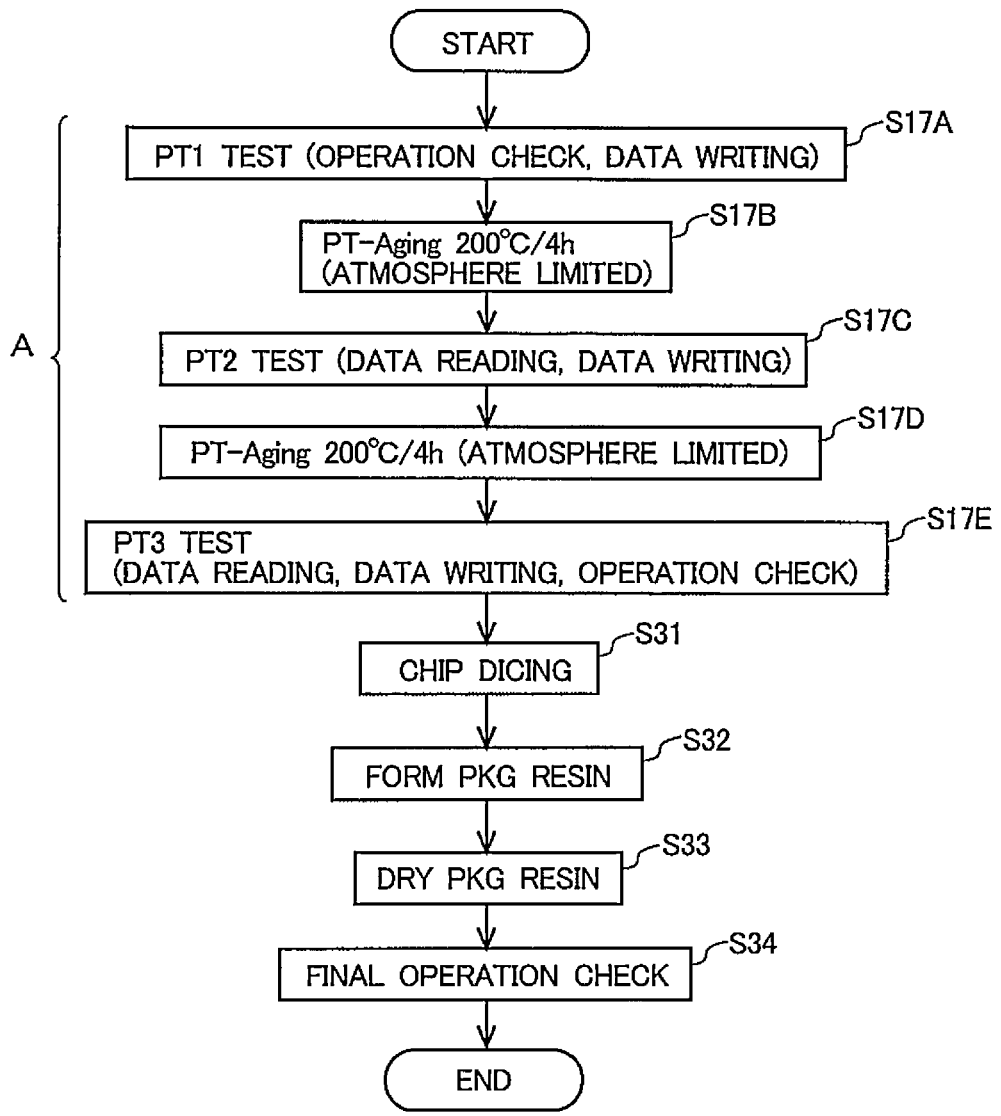
FIG. 18 is a view illustrating a process after a probe test.

FIGS. 17 and 18 illustrate an outline of an FeRAM manufacturing process according to a first embodiment of the present disclosure. FIG. 17 is a flowchart illustrating a process till an aperture of the pad electrode is formed. To begin with, the transistor layer is formed on a semiconductor substrate (which is also termed a wafer) (S1).

Next, the inter-layer insulating film is formed (S2). Then, the ferroelectric capacitor is formed. The ferroelectric capacitor includes a lower electrode (e.g., Pt), a dielectric film (e.g., PZT) and an upper electrode (e.g., $IrO_2$). Moreover, the hydrogen/water barrier film ($Al_2O_3$) covering the ferroelectric capacitor is formed (S3).

Subsequently, the inter-layer insulating film is formed upwardly of the ferroelectric capacitor, and a plug layer of tungsten, which is connected to the wiring layer provided further upwardly of the inter-layer film is formed (S4). Moreover, a first wiring layer connected to the plug layer is formed.

The first wiring layer is formed from, e.g. Al—Cu in the way of being embedded in a trench portion. Then, the barrier film for hindering the permeation of the hydrogen and the water content is formed from $Al_2O_3$ upwardly of the first wiring layer (S5).

Next, the inter-layer insulating film is formed upwardly of the first wiring layer and flattened. Further, the flat barrier film for hindering the permeation of the hydrogen and the water content is formed from $Al_2O_3$ (S6). Thereafter, the processes in S4 trough S6 are repeated for the necessary wiring layers. Then, the uppermost insulating film and plug layer are formed, and the pad electrode connected to the plug layer is formed (S7).

Subsequently, an oxide film covering the pad electrode is formed (S8). Moreover, a nitride film SiN is formed (S9). Then, an aperture is formed in an upper portion of the pad electrode on the basis of a resist pattern (S10). Further, the oxide film and the nitride film formed upwardly of the pad electrode are etched (S11). The surface of the pad electrode is thereby exposed.

Next, the passivation film is formed from the novolac resin (S12). Furthermore, the passivation film is cured (curing treatment) in a heating furnace at a temperature of 200° C. or under, e.g., a temperature ranging from 170° C. up to 190° C. for about 40 min (S13). The atmosphere within the heating furnace when cured is set to a nitrogen atmosphere (or alternatively an inactive gas atmosphere) each time.

FIG. 18 is a flowchart illustrating a primary test (which will hereinafter be abbreviated to PT) after forming the aperture of the pad electrode through a final operation check process after packaging. In FIG. 18, the process represented by a symbol "A" corresponds to a probe test.

Herein, at first, a probe is brought into contact with the pad electrode, and the PT1 test involves checking an input/output operation via the pad electrode. Then, a first data writing operation is done (S17A).

In the PT1 test defined as an initial test, a stage temperature of a wafer chuck is raised to 90° C., and the PT1 test is performed. This intends to perform the test under severer conditions than at the normal temperature.

To give the simplest explanation of the PT1 test, to begin with, it is checked whether a circuit responds correctly or not by applying a power source voltage. Next, the operation is checked at a plurality of points in, e.g., a power source voltage operation range. Next, a variety of test patterns are carried out, and, after confirming that the circuit operates without any failure, the data is finally written.

Subsequently, the FeRAM is a nonvolatile memory, and hence a test about whether the once-written data is correctly read out or written is to be performed by way of a PT2 test or PT3 test.

Next, the probe is removed, then the semiconductor substrate is introduced into the heating furnace filled with the nitride gas (or the inactive gas such as an argon gas), and an aging test based on heating is carried out (S17B). This is because, in the case of using the novolac resin for the passivation film, the novolac resin on the uppermost surface gets deteriorated when aging in an air atmosphere. The aging test involves keeping a state of, e.g., 200° C. for approximately 4 hours.

Thereafter, the semiconductor substrate is taken out of the heating furnace, and the PT2 test is executed. Namely, the probe is again brought into contact with the pad electrode, then the data is read out, and the second data writing operation is done (S17C).

Then, the probe is removed, and the second aging test is carried out (S17D). The conditions for the aging test are the same as those for the first aging test. Thereafter, the semiconductor substrate is taken out of the heating furnace, and the PT3 test is executed. To be specific, the probe is again brought into contact with the pad electrode, the data is read out, and the third data writing operation is carried out. Thus, the operation of the ferroelectric capacitor via the pad electrode is checked (S17E).

Next, the chip is diced (S31). Then, each of the chips cut out by dicing is sealed with the package resin (S32). At this time, in the case of the chip including the novolac resin for the passivation film, when heated in the air atmosphere, the novolac resin on the uppermost surface becomes deteriorated. Especially when a temperature of the die for the package resin is equal to or higher than 100° C., the novolac resin is easy to deteriorate. Accordingly, the package resin is formed while causing the nitrogen atmosphere or the argon atmosphere to flow into the die for the package.

Next, the package resin is dried (S33). At this time, the novolac resin is not exposed directly to the oxygen contained in the air, and hence the novolac resin on the uppermost surface does not deteriorate. Even when the novolac resin is not exposed to the oxygen, the drying temperature shall be set equal to or lower than 280° C. This intends to restrain the deterioration of the novolac resin and of the ferroelectric substance under the high temperature.

Then, the final operation check of the FeRAM chip is conducted (S34).

First Working Example

A first working example of the present disclosure will hereinafter be described with reference to FIGS. 2A-16B. FIG. 2A is a view illustrating a process of forming a transistor to be configured on a lowermost layer of the FeRAM device. To start with, an element separation region 12 for defining an element region is formed on a semiconductor substrate 10 composed of silicon etc. Next, a well 13 is formed by implanting an impurity into the semiconductor substrate 10 formed with the element separation region 12. A gate electrode 15 is formed via an unillustrated gate insulating film on the semiconductor substrate 10 formed with the well 13. Further, a sidewall insulating film 16 is formed along a sidewall portion of the gate electrode 15. Source/drawing diffusion layers 17 are provided on both sides of the gate electrode 15 formed with the sidewall insulating film 16.

Figure 2B:
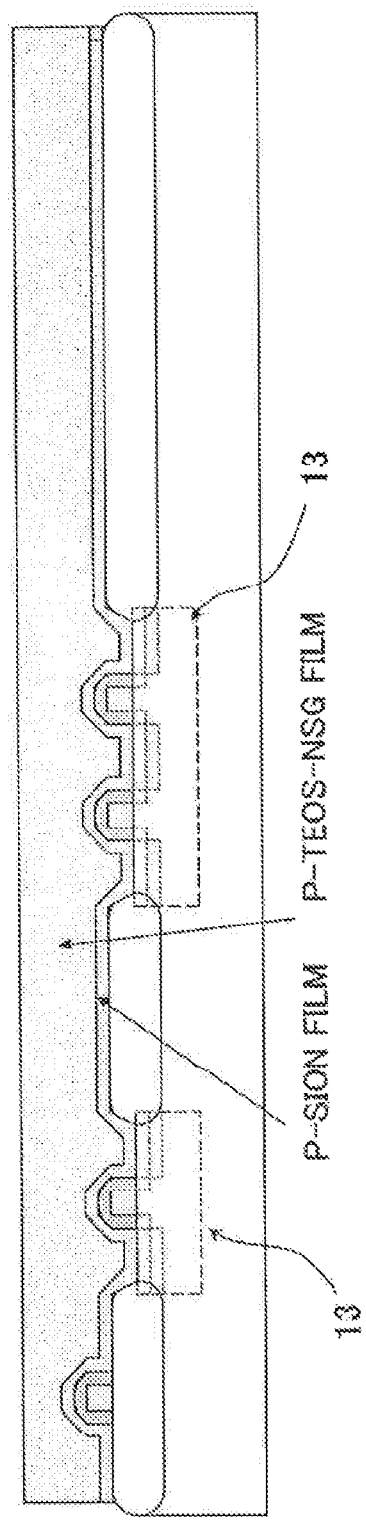
FIG. 2B is a view illustrating a process of forming an inter-layer insulating film.

FIG. 2B depicts a process of forming the inter-layer insulating film. Herein, an inter-layer insulating film P (plasma)-SiON (silicon oxide-nitride) is grown up to 200 nm by CVD (Chemical Vapor Deposition) on the semiconductor substrate formed with the transistor. Further, a P-TEOS (tetraethoxysilane)-NSG (non-doped silicate glass) film is grown up to 600 nm by the CVD on the P-SiON film. Thereafter, the P-TEOS-NSG film is polished on the order of 200 nm through a CMP (Chemical Mechanical Polishing) process, and the surface thereof is flattened.

FIG. 2C illustrates a process of how an $Al_2O_3$ film is formed. Herein, the P-TEOS-NSG film is grown up to 100 nm by the CVD on the P-TEOS-NSG film. Dehydration of the P-TEOS-NSG film involves executing a dehydrating process, e.g., at 650° C. at a $N_2$ flow rate of 1 liter/min for about 30 min. Further, the $Al_2O_3$ film (which is an aluminum film represented by ALO FILM in FIG. 2C) is grown up to 20 nm by, e.g., PVD (Physical Vapor Deposition) on the P-TEOS-NSG film. Then, after growing the $Al_2O_3$ film, for example, an RTA (Rapid Thermal Anneal) apparatus executes the thermal treatment at 650° C. at an $O_2$ flow rate of 1 liter/min for about 60 min.

Figure 3A:
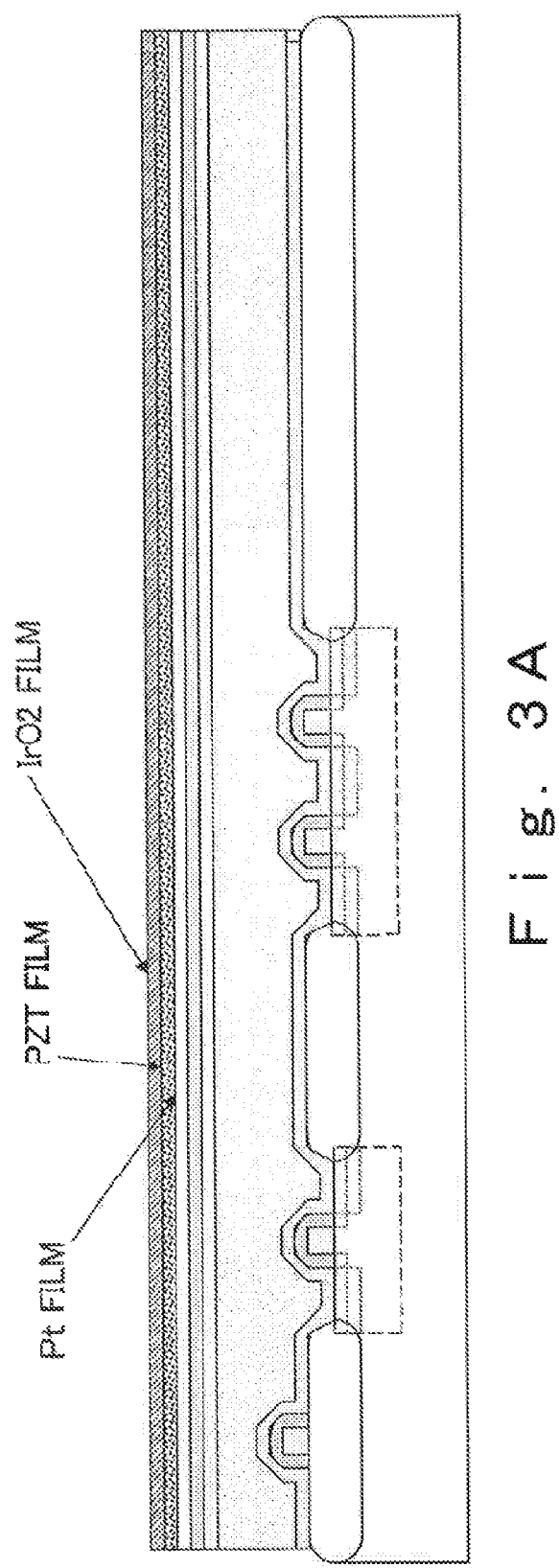
FIG. 3A is a view illustrating a process of how a layer of a ferroelectric capacitor is grown.

FIG. 3A illustrates a process of growing a film of the ferroelectric capacitor. Herein, a Pt film is grown up to 155 nm as the lower electrode by, e.g., the PVD on the $Al_2O_3$ film.

A PZT (lead zirconate titanate) film is grown up to 150-200 nm by, e.g., the PVD on the thus grown Pt film. After growing the PZT film, an annealing treatment based on RTA (Rapid Thermal Annealing) is carried out. Annealing conditions are given such that the temperature is 585° C., the $O_2$ flow rate is 0.025 liter/min, and the annealing time is 90 sec.

Next, an $IrO_2$ (iridium oxide) film is grown up to 50 nm as the uppermost surface on the PZT film by, e.g., the PVD. After growing the $IrO_2$ film, the annealing treatment is executed based on, e.g., the RTA. The annealing conditions are given such that the temperature is 725° C., the $O_2$ flow rate is 0.025 liter/min, and the annealing time is 20 sec. Next, the $IrO_2$ film is again grown up to 200 nm on the $IrO_2$ film by, e.g., the PVD.

Figure 3B:
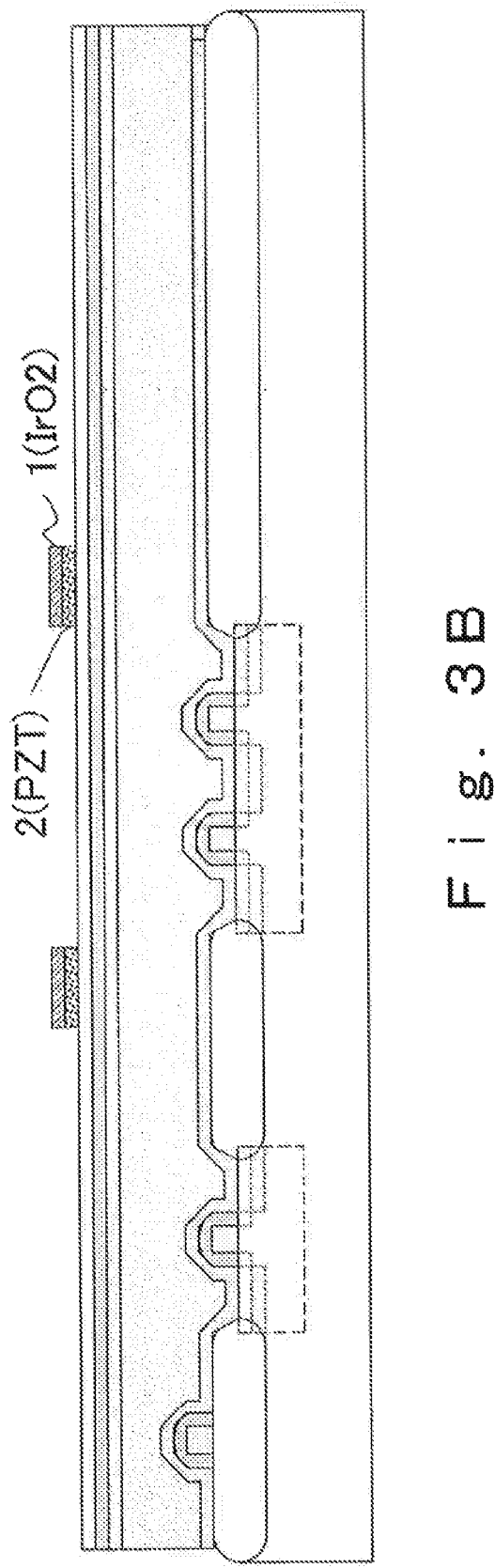
FIG. 3B is a view illustrating a process of forming a pattern of the ferroelectric capacitor.

FIG. 3B depicts a pattern forming process for the ferroelectric capacitor. Herein, formation of a pattern 1 of the upper electrode involves forming a pattern based on a photo resist and etching the $IrO_2$ film.

Then, the thermal treatment using, e.g., a vertical furnace is executed for recovery anneal of the PZT film. Thermal treatment conditions are given such that, normally, for example, the temperature is 650° C., the $O_2$ flow rate is 20 liter/min, and the treatment time is 60 min.

Then, the formation of a pattern 2 of the ferroelectric capacitor involves forming the photo resist and etching the PZT film.

Moreover, the thermal treatment using, e.g., the vertical furnace is performed for the recovery anneal of the PZT film. The thermal treatment conditions are given such that, for example, the temperature is 350° C., the $O_2$ flow rate is 20 liter/min, and the treatment time is 60 min. Thereafter, the $Al_2O_3$ film is grown up to 50 nm (unillustrated) by, e.g., the PVD on the entire surface of the wafer for protecting the PZT film. After growing the $Al_2O_3$ film, the thermal treatment using, e.g., the vertical furnace is executed. The thermal treatment conditions are given such that, for example, the temperature is 550° C., the $O_2$ flow rate is 20 liter/min, and the treatment time is 60 min.

Figure 4A:
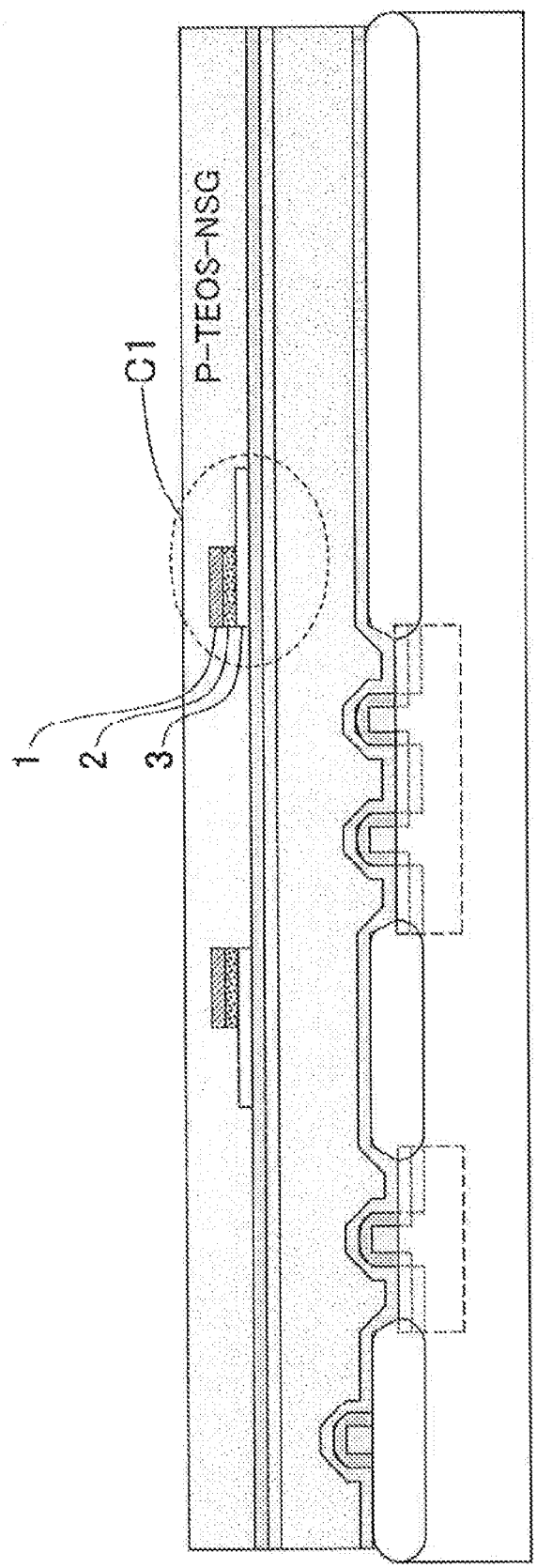
FIG. 4A is a view illustrating a process of forming an inter-layer insulating film.

FIG. 4A depicts an inter-layer insulating film forming process. Herein, the formation of a pattern 3 of the lower electrode involves forming a pattern based on the photo resist and etching the Pt film.

Next, the thermal treatment using, e.g., the vertical furnace is performed for the recovery anneal of the PZT film. The thermal treatment conditions are given such that, for example, by standard, the temperature is 650° C., the $O_2$ flow rate is 20 liter/min, and the treatment time is 60 min.

Thereafter, the $Al_2O_3$ film is grown up to 20 nm (unillustrated) by, e.g., the PVD on the entire surface of the wafer for protecting the ferroelectric capacitor. After growing the $Al_2O_3$ film, the thermal treatment using, e.g., the vertical furnace is carried out. The thermal treatment conditions are given such that the temperature is 550° C., the $O_2$ flow rate is 20 liter/min, and the treatment time is 60 min.

The P-TEOS-NSG film is grown up to 1500 nm by, e.g., the CVD so as to completely cover the ferroelectric capacitor. After growing the P-TEOS-NSG film, the surface thereof is flattened by the CMP process.

Figure 4B:
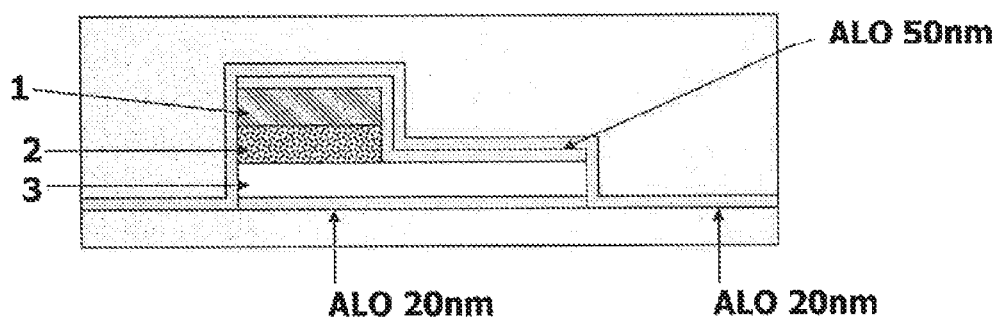
FIG. 4B is an enlarged view of the ferroelectric capacitor.

FIG. 4B illustrates an enlarged view of the ferroelectric capacitor (corresponding to a portion Cl depicted by a dotted-line circle in FIG. 4A). The ferroelectric capacitor includes the lower electrode formed on the $Al_2O_3$ film, the ferroelectric substance (PZT) on the lower electrode, and the upper electrode. Further, the $Al_2O_3$ film covers the side faces of the lower electrode (pattern 3) and of the ferroelectric substance (pattern 2) and the side face and the upper surface of the upper electrode (pattern 1).

Figure 5:
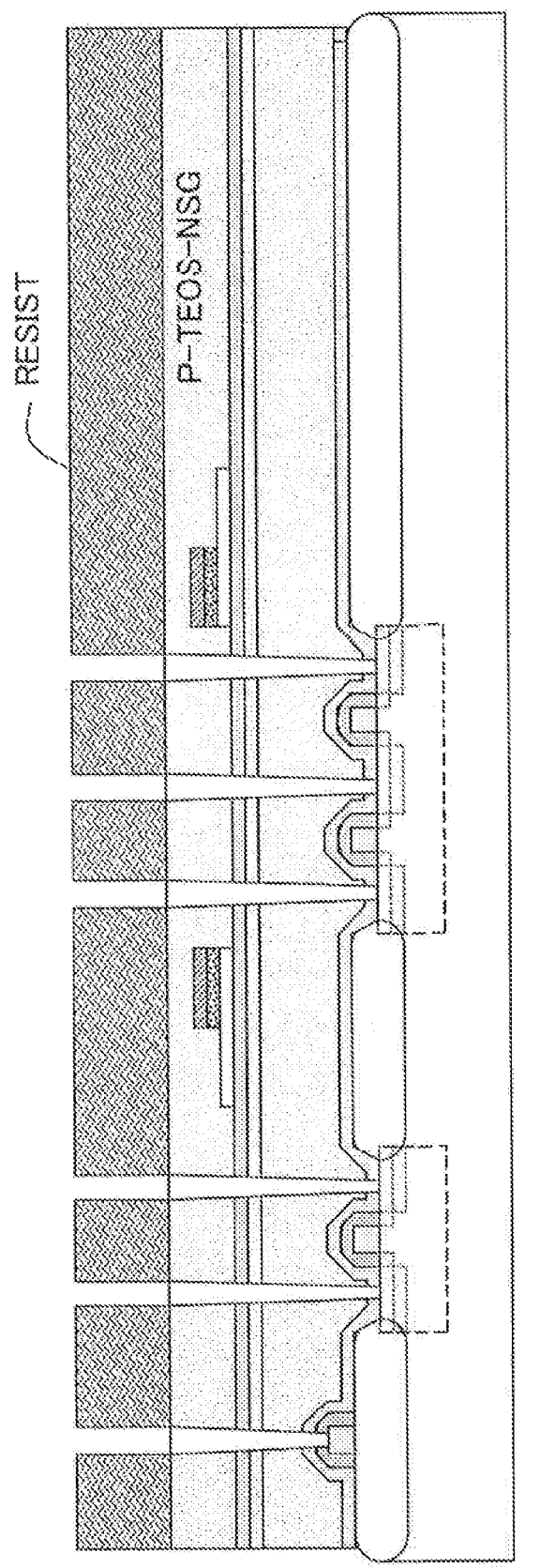
FIG. 5 is a view illustrating a process of forming a plug.

FIG. 5(15) illustrates a plug (bulk contact) forming process. Herein, the plasma annealing is performed by, e.g., a CVD apparatus for nitriding the surface of the P-TEOS-NSG film. The thermal treatment conditions are given such that $N_2O$ plasma is employed, the temperature is 350° C., and the treatment time is 2 min. Further, formation of the bulk contact involves forming the resist pattern and etching the inter-layer insulating film.

Figure 6A:
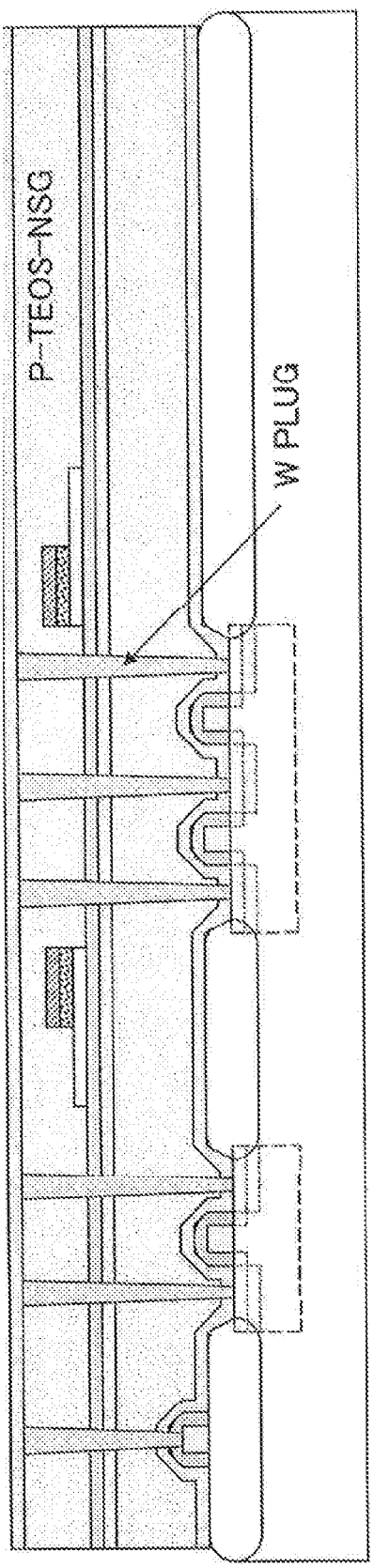
FIG. 6A is a view illustrating a process of forming a contact with the capacitor (part 1)
Figure 6B:
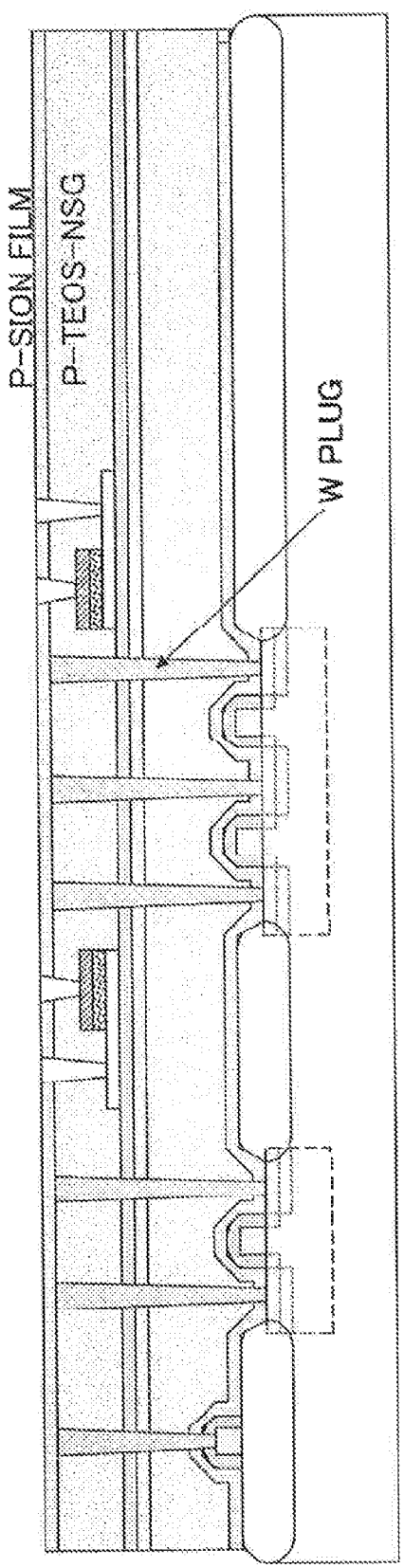
FIG. 6B is a view illustrating a process of forming the contact with the capacitor (part 2)

FIGS. 6A and 6B depict the capacitor and a contact forming process. Herein, Ti is deposited up to 20 nm and TiN is deposited up to 50 nm (Ti 20 nm+TiN 50 nm) on the entire surface of the wafer by, e.g., the PVD in order to form a barrier metal of the bulk contact (unillustrated). Then, after forming the barrier metal, a W film is grown up to 500 nm by, for instance, the CVD. Moreover, for removing the W film other than the bulk contact, the W film is polished by, e.g., the CMP process. Next, the plasma annealing is conducted by, e.g., the CVD apparatus in order to nitride the surface of the P-TEOS-NSG film. The thermal treatment conditions are given such that, for instance, the atmosphere is an $N_2O$ plasma atmosphere, the temperature is 350° C., and the treatment time is 2 min. Further, the P-SiON film is grown up to 100 nm by, e.g., the CVD on the P-TEOS-NSG film.

Subsequently, the formation of contacts of the upper electrode and of the lower electrode involve forming the resist pattern on the P-SiON film (unillustrated). Then, as illustrated in FIG. 6B, with the resist pattern serving as a mask, contact holes of the upper electrode and of the lower electrode are formed by etching. Moreover, the thermal treatment using, e.g., the vertical furnace is performed for the recovery anneal of the PZT film. The thermal treatment conditions are given such that, for example, the temperature is 500° C., the $O_2$ flow rate is 20 liter/min, and the treatment time is 60 min.

Figure 7A:
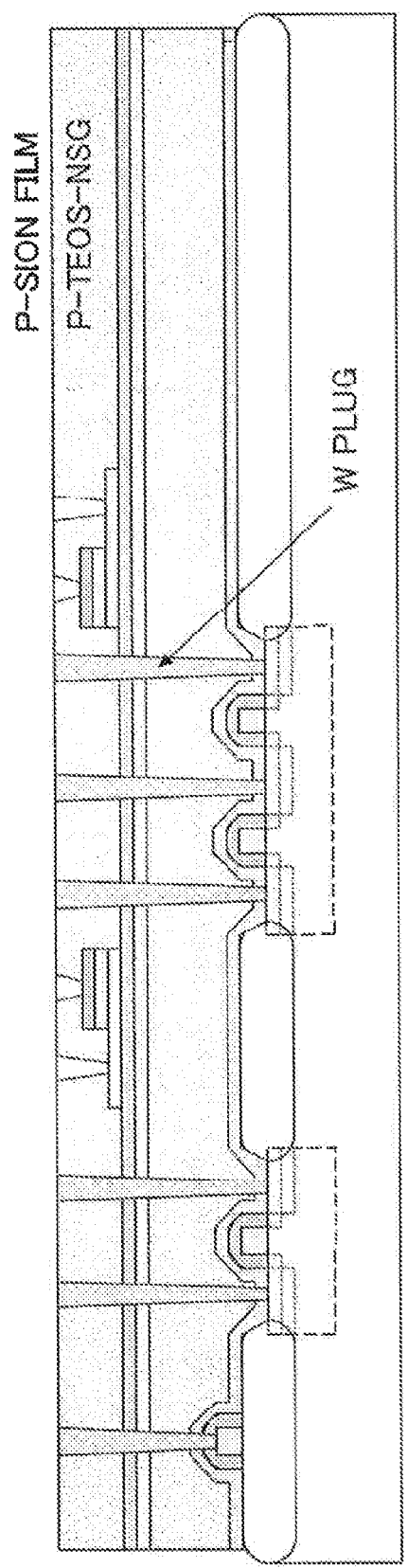
FIG. 7A is a view illustrating a process of forming a first wiring layer.
Figure 7B:
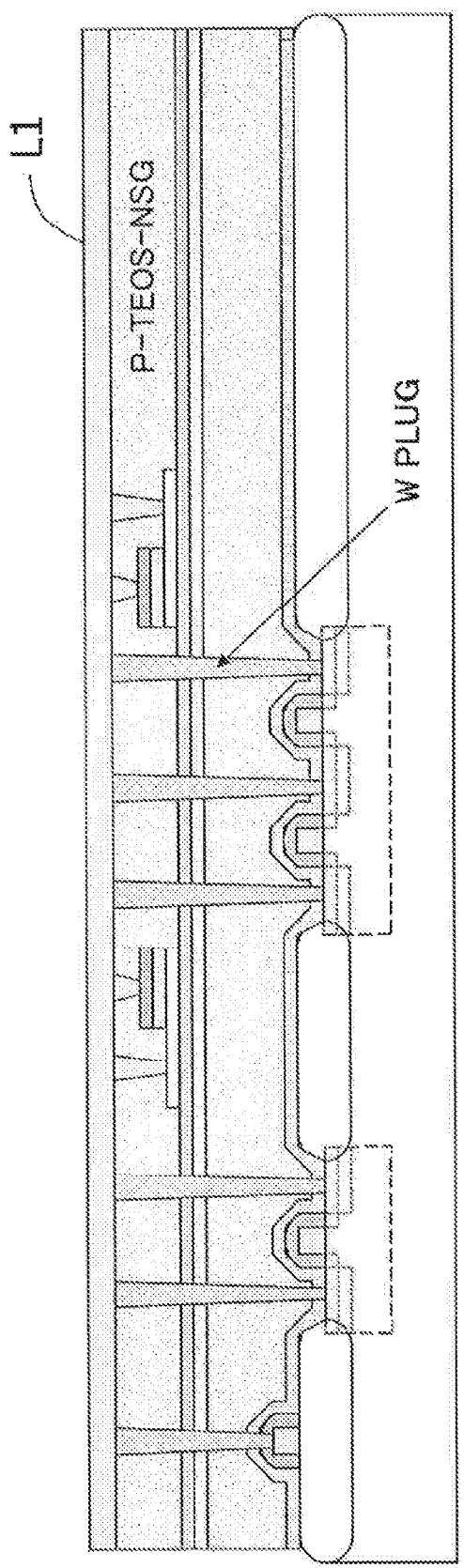
FIG. 7B is a view illustrating a process of forming a second wiring layer.

FIGS. 7A and 7B illustrate a process of forming the first wiring layer. Herein, for removing the P-SiON film, the entire surface of the P-SiON film is etched back in, e.g., the etching process.

Next, as depicted in FIG. 7B, the formation of the first wiring layer involves stacking the films such as TiN 150 nm+Al—Cu 550 nm+Ti 5 nm+TiN 150 nm by, e.g., the PVD. In FIG. 7B, however, the illustration of the stacked films is omitted, and the stacked films are generically depicted as the first wiring layer L1 (the pattern is not yet formed).

Figure 8:
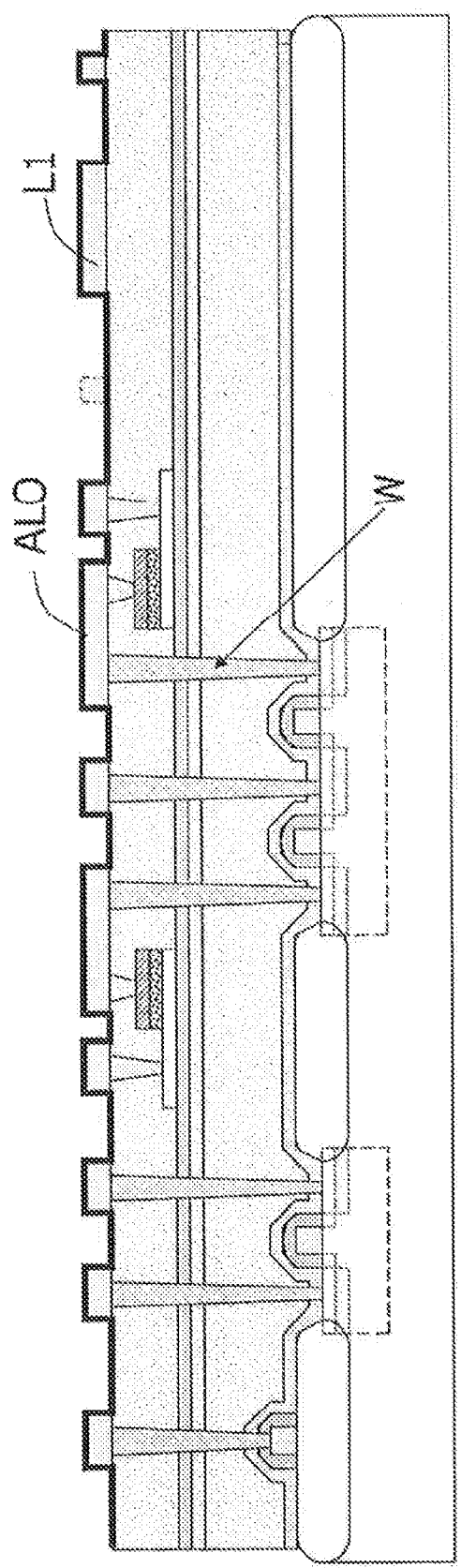
FIG. 8 is a view illustrating a process of forming the aluminum film of the first wiring layer.

FIG. 8 illustrates a process of forming the $Al_2O_3$ film of the first wiring layer. Herein, the resist pattern is formed in order to form the pattern of the first wiring layer L1, and, with the resist pattern serving as the mask, the first wiring layer is etched. Moreover, after forming the pattern of the first wiring layer L1, the thermal treatment using, e.g., the vertical furnace is performed at 350° C. at the $N_2$ flow rate of 20 liter/min for 30 min. Further, the $Al_2O_3$ film is grown up to 20 nm by, e.g., the PVD on the first wiring layer and the P-TEOS film. The $Al_2O_3$ film functions as the barrier film against the hydrogen and water content.

Figure 9:
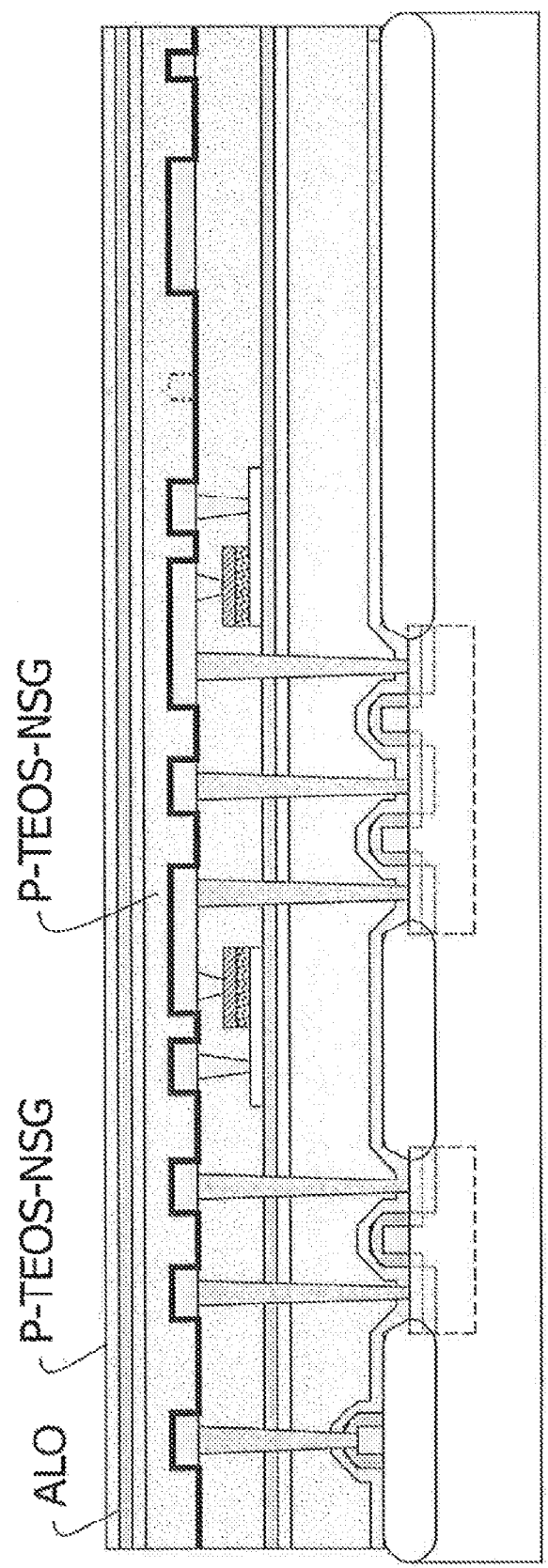
FIG. 9 is a view illustrating a process of forming the inter-layer insulating film and the flat aluminum film.
Figure 10:
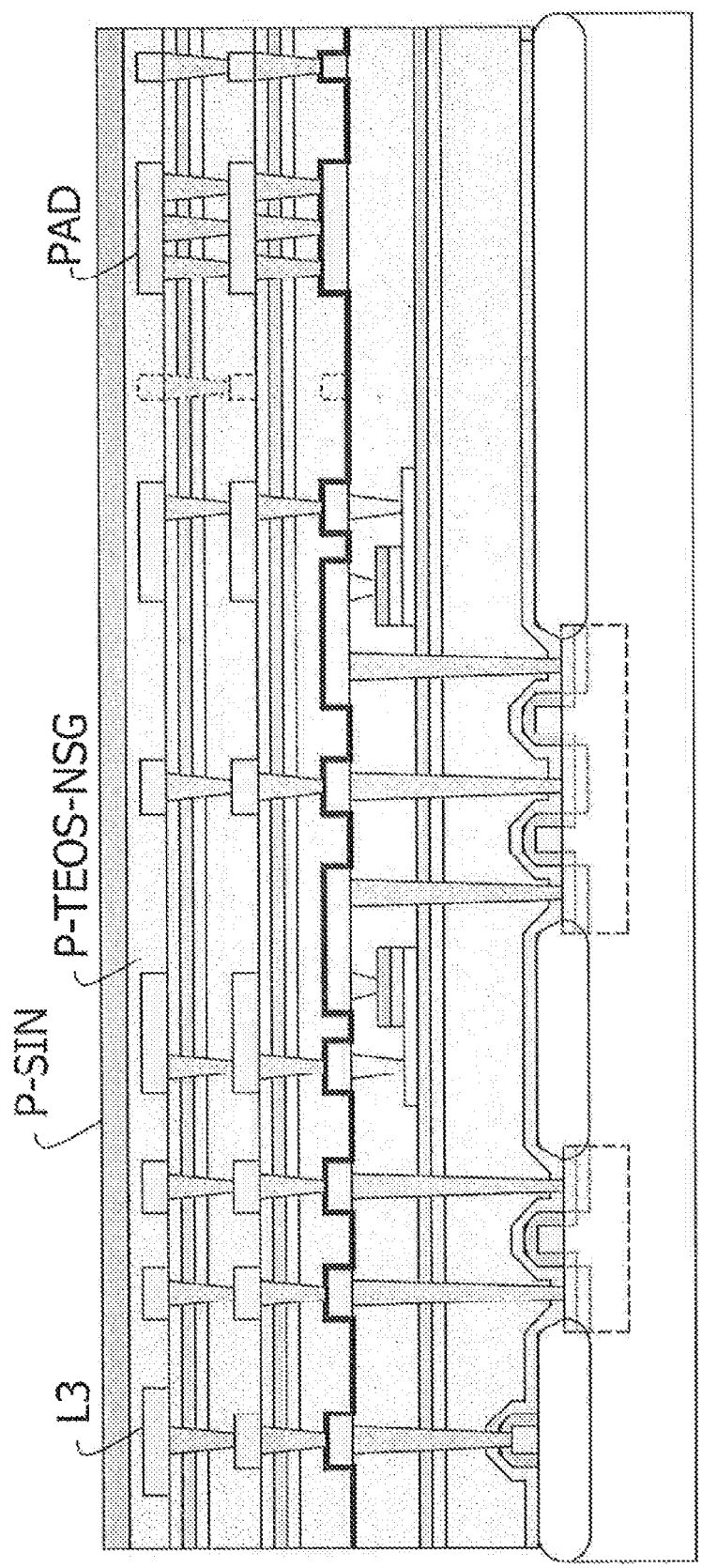
FIG. 10 is a view illustrating a process of forming a nitride film on a third wiring layer.

FIG. 9 illustrates a process of forming the inter-layer insulating film and the flat $Al_2O_3$ film. Herein, the P-TEOS-NSG film is grown up to 2600 nm by the, e.g., CVD on the $Al_2O_3$ film, then the P-TEOS-NSG film is polished by, for instance, the CMP process in order to flatten the whole, and the wafer surface is flattened.

Moreover, the plasma annealing is conducted by, e.g., the CVD apparatus for nitriding the surface of the P-TEOS-NSG film. The annealing conditions are given such that the atmosphere is the $N_2O$ plasma atmosphere, the temperature is 350° C., and the annealing time is 4 min. Then, the P-TEOS-NSG film is again grown up to 100 nm by, e.g., the CVD.

Furthermore, the $Al_2O_3$ film is grown up to 50 nm by, e.g., the PVD on the P-TEOS-NSG film. The P-TEOS-NSG film is grown up to 100 nm by, e.g., the CVD on the $Al_2O_3$ film. The plasma annealing is carried out by, e.g., the CVD apparatus for nitriding the surface of the P-TEOS-NSG film. The annealing conditions are given such that the atmosphere is the $N_2O$ plasma atmosphere, the temperature is 350° C., and the annealing time is 2 min.

Hereinafter, similarly, a wiring pattern of a third wiring layer and the pad electrode connected to this wiring pattern are formed through the plug (the contact hole between the layers) forming process, the second wiring layer forming process, the inter-layer film/$Al_2O_3$ film forming process, the plug forming process and the third wiring layer forming process. Moreover, a nitride film (P-SiN) depicted in FIG. 10 as an upper layer thereon.

To give a more detailed description, at first, the P-TEOS-NSG film serving as the passivation film is grown up to 100 nm by, e.g., the CVD upwardly of the third wiring layer L3. Further, the plasma annealing is performed by, e.g., the CVD apparatus for nitriding the surface of the P-TEOS-NSG film. The annealing conditions are given such that the atmosphere is the $N_2O$ plasma atmosphere, the temperature is 350° C., and the annealing time is 2 min. Moreover, a P (plasma)-SiN (silicon nitride) film serving as the passivation film is grown up to 350 nm by, e.g., the CVD upwardly of the P-TEOS-NSG film.

Figure 11A:
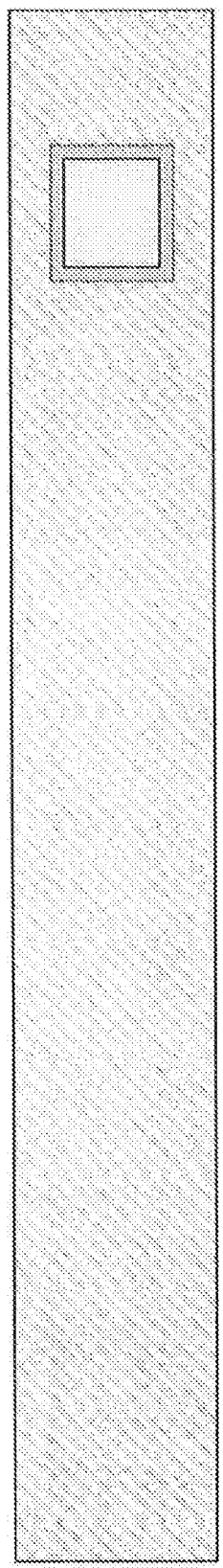
FIG. 11A is a plan view illustrating a process of forming a novolac resin film.
Figure 11B:
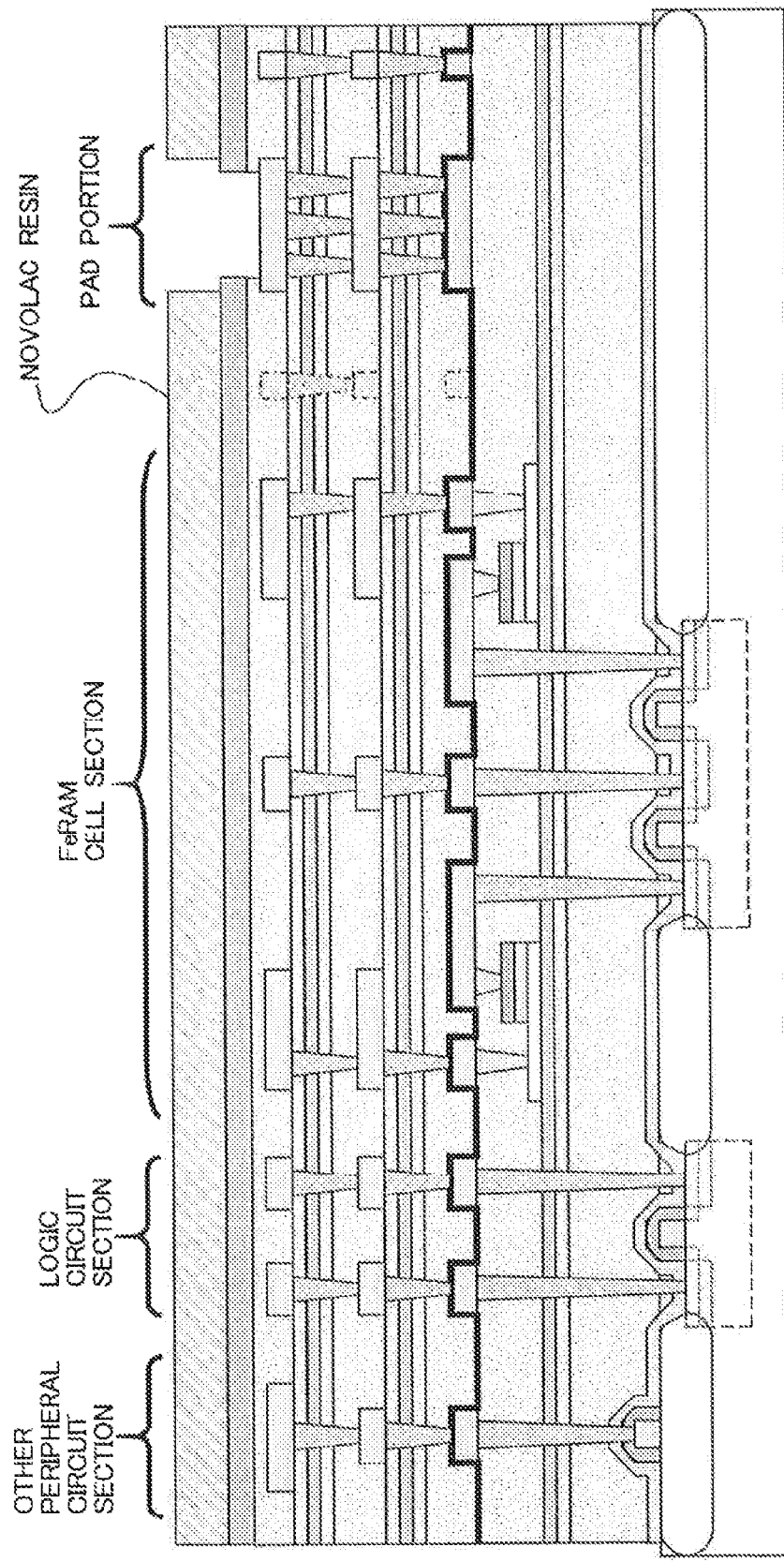
FIG. 11B is a sectional view illustrating the process of forming the novolac resin film.

FIGS. 11A and 11B illustrate a novolac resin forming process. Herein, FIG. 11A is a plan view of a substrate on which to form the novolac resin film as viewed from upwards, and FIG. 11B is a sectional view on this occasion.

The resist pattern is formed on the P-SiN film for providing the pad (PAD) portion. Then, with the resist pattern serving as the mask, the PAD portion is etched. The etching process involves etching the P-TEOS-NSG film and the P-SiN film, and simultaneously etching the upper TiN film, having the thickness of 150 nm, of the third wiring stacked layer.

After forming the PAD portion, a photosensitive novolac resin is coated by way of a protective film, thus forming the protective film to protect regions other than the PAD portion. After forming the novolac resin film, the thermal treatment is carried out in, e.g., a horizontal furnace (corresponding to a heating furnace according to the present disclosure) under such conditions that the temperature is 180° C., the $N_2$ flow rate is 100 liters/min, and the treatment time is 40 min, thereby curing the novolac resin. This novolac resin film is also called a cover film (a buffer film or a device protective film). In this case, the novolac resin in the first embodiment has a resist function. For example, the novolac resin has a characteristic that is insoluble to a developing liquid after coating the resin. After coating the novolac resin, when irradiated with beams of exposure light, a photo-sensitizer contained in the novolac resin (essentially, a solution) is dissolved, and the dissolved photo-sensitizer causes the insoluble characteristic to the developing liquid of the novolac resin to disappear. Accordingly, after coating the novolac resin, an area irradiated with the beams of exposure light becomes soluble to the developing liquid.

Procedures for forming the novolac resin protective film are given as follows. Executed, to be specific, are (1) coating of the novolac resin, (2) pre-baking (low-temperature curing), (3) an exposure process, (4) post-baking (low-temperature curing), (5) a developing process, (6) dehydration baking (low-temperature curing) and (7) bridging of the novolac resin (final curing). Namely, in the first embodiment, the light is projected upon the PAD portion through the exposure mask and developed by the developing liquid, thereby forming the aperture of the novolac resin.

Note that if the novolac resin is composed of a material containing none of the photo-sensitizer, the resist pattern is formed on the upper layer of the novolac resin, and the PAD portion is formed with the aperture. Then, the aperture portion, which is not covered with the resist pattern, may be removed by a solvent that dissolves the novolac resin.

Thereafter, the ferroelectric memory (FeRAM) chip is completely manufactured through the testing process and the packaging process.

As discussed above, according to the FeRAM manufacturing process in the first embodiment, at least mono-layered flat $Al_2O_3$ barrier film (see ALO in FIG. 9) for hindering the permeation of the hydrogen and the water content is provided between the ferroelectric capacitor and the passivation film containing the novolac resin. Then, the thermal treatment is conducted in the nitrogen atmosphere with the oxygen being restrained or the inactive gas atmosphere of Ar etc at the temperature equal to or lower than 200° C. that is a lower temperature than by hitherto using the polyimide. As a result, after decreasing the thermal influence on the ferroelectric substance, the cover film can be formed. Further, the thermal treatment is performed in the nitrogen atmosphere, which therefore enables the deterioration of the novolac resin to be reduced.

Second Embodiment

Figure 19:
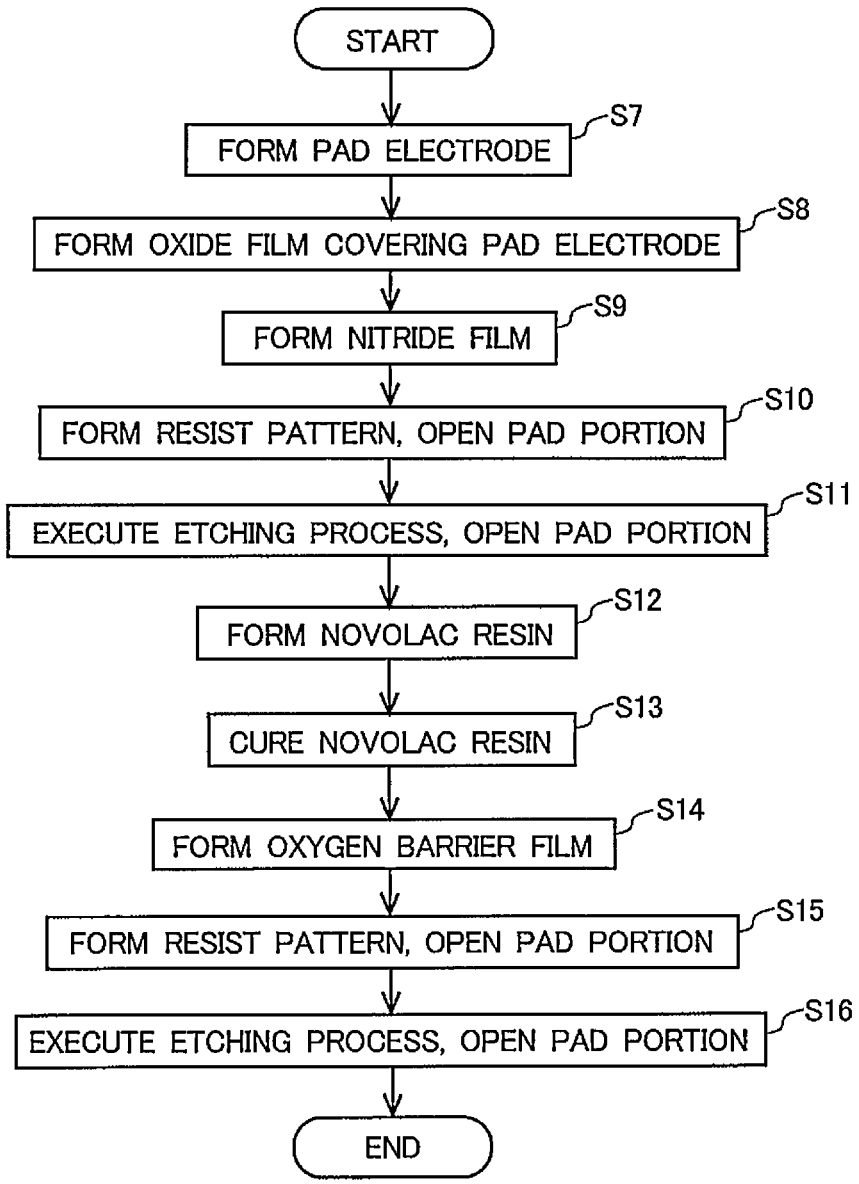
FIG. 19 is a view illustrating the ferroelectric memory and an outline of the manufacturing method thereof according to a second embodiment of the present disclosure.

FIG. 19 illustrates the FeRAM and an outline of a manufacturing process thereof according to a second embodiment. In the first embodiment, after at least the mono-layered flat barrier film against the hydrogen and the water content has been formed upwardly of the ferroelectric capacitor, the novolac resin film is formed as the passivation film (cover film) at the curing temperature equal to or lower than 200° C. (typically 180° C.) in the nitrogen atmosphere. In the second embodiment, an oxygen barrier film is formed further upwardly of the passivation film containing the novolac resin. Other processes in the second embodiment are the same as those in the first embodiment. Such being the case, the description of the processes till the formation of the novolac resin is omitted. Accordingly, in FIG. 19, the steps up to S13 are the same as in the case (FIG. 17) of the first embodiment. Further, in FIG. 19, the processes in S1-S6 are omitted.

To be specific, in the second embodiment, after the thermal treatment (S13) for the novolac resin, the oxygen barrier film is formed (S14). Then, a resist pattern opened in the upper layer of the PAD portion is formed (S15). Moreover, the oxygen barrier film on the pad electrode is removed by the etching process, thus opening the PAD portion.

Second Working Example

A working example of the FeRAM and the manufacturing process thereof according to the present disclosure will hereinafter be described with reference to FIGS. 12 and 13.

Figure 12:
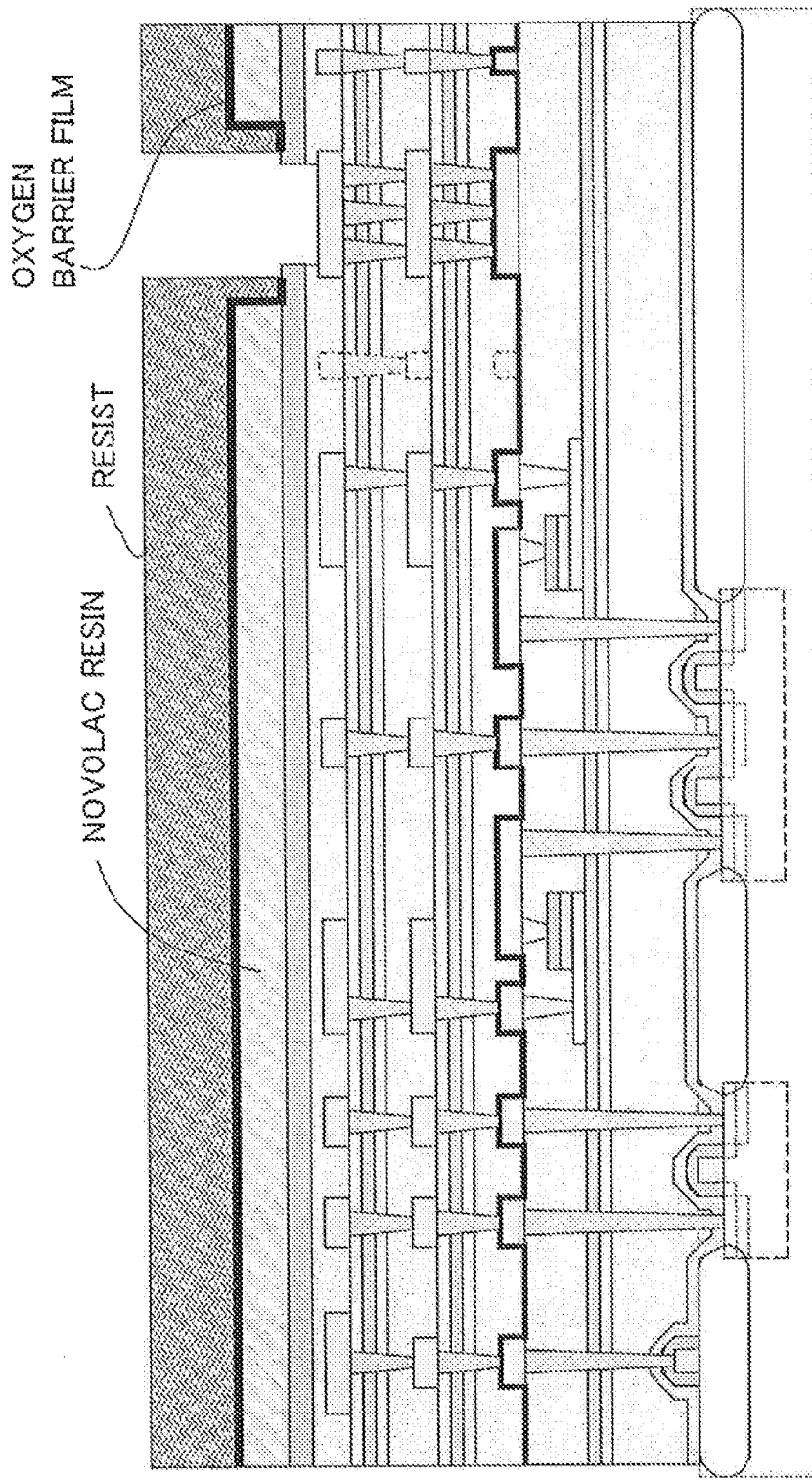
FIG. 12 is a view illustrating a process of forming an oxygen barrier film.
Figure 13A:
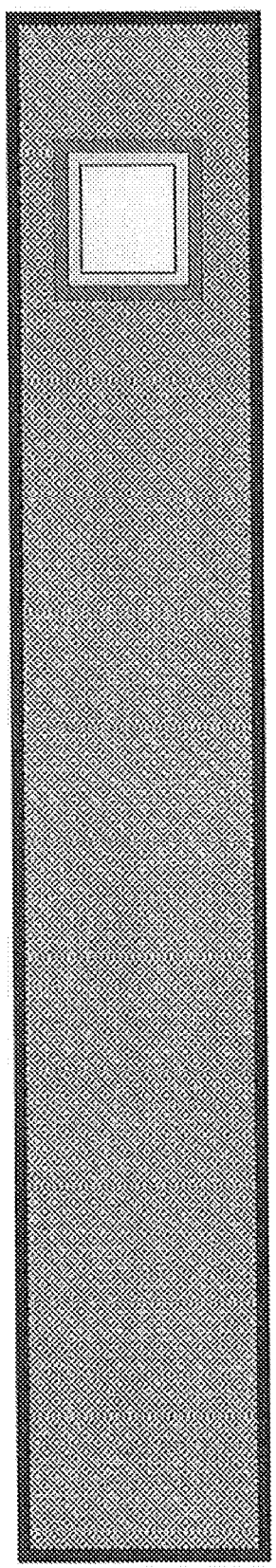
FIG. 13A is a plan view illustrating a configuration after etching the oxygen barrier film and removing a resist.
Figure 13B:
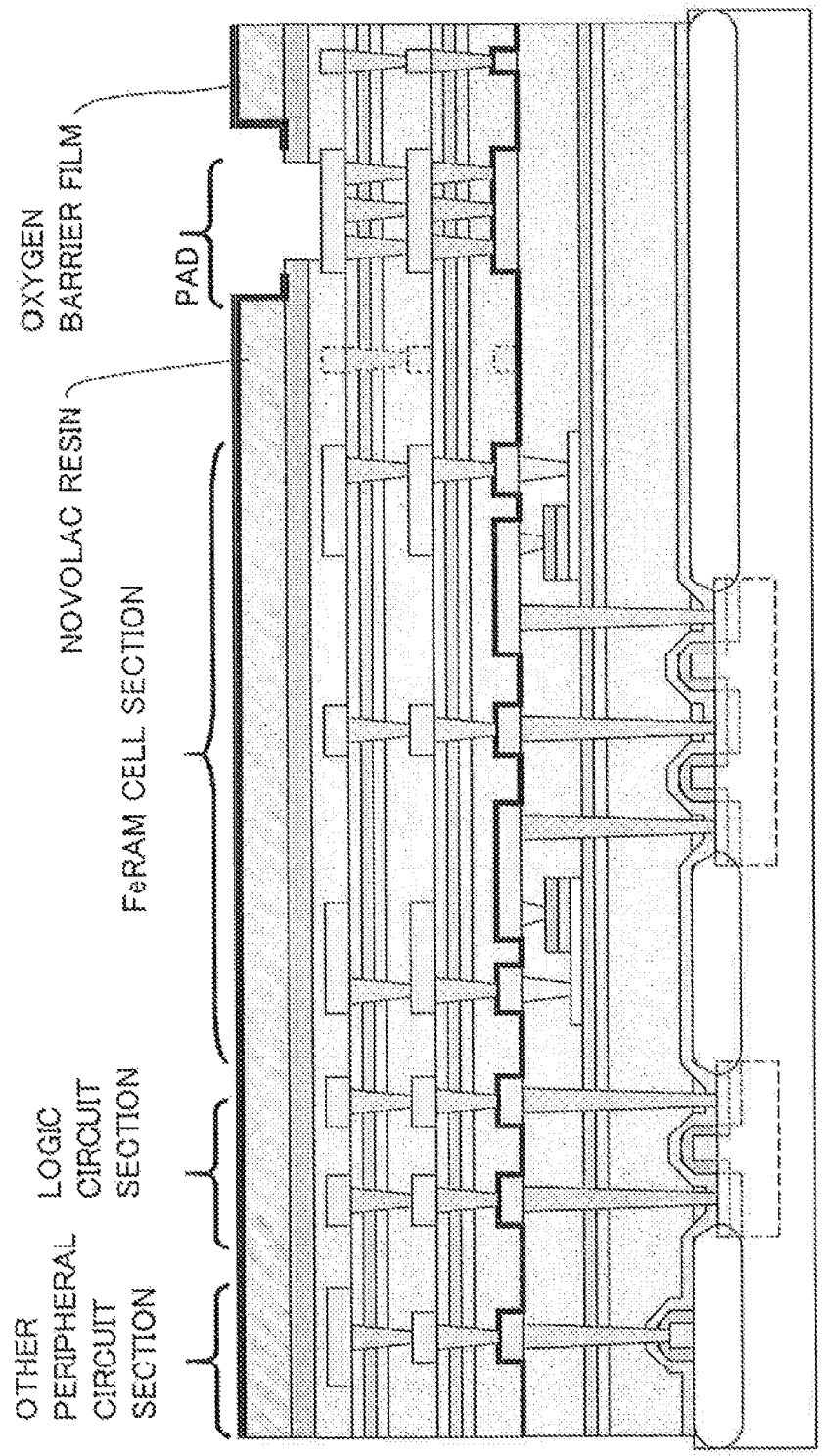
FIG. 13B is a sectional view illustrating the configuration after etching the oxygen barrier film and removing the resist.

FIG. 12 illustrates an oxygen barrier film forming process after the novolac resin film has been formed. Herein, the oxygen barrier film composed of AlO, TiOx, etc is sputtered by, e.g., the PVD on the cured novolac resin. The film thickness is on the order of, e.g., 20 nm through 50 nm. Next, the resist pattern is formed on the oxygen barrier film. Then, with the resist pattern serving as the mask, the oxygen barrier film of AlO, TiOx, etc, which is formed on the PAD portion, is removed. Further, the resist is removed. FIGS. 13A and 13B are plan view and a sectional view each depicting a configuration after removing the resist.

Thereafter, the ferroelectric memory (FeRAM) chip is completely manufactured through the testing process and the packaging process.

As discussed above, according to the second embodiment, after the passivation film (cover film) using the novolac resin has been formed on the uppermost surface, the barrier film against the oxygen is formed.

Third Embodiment

Figure 20:
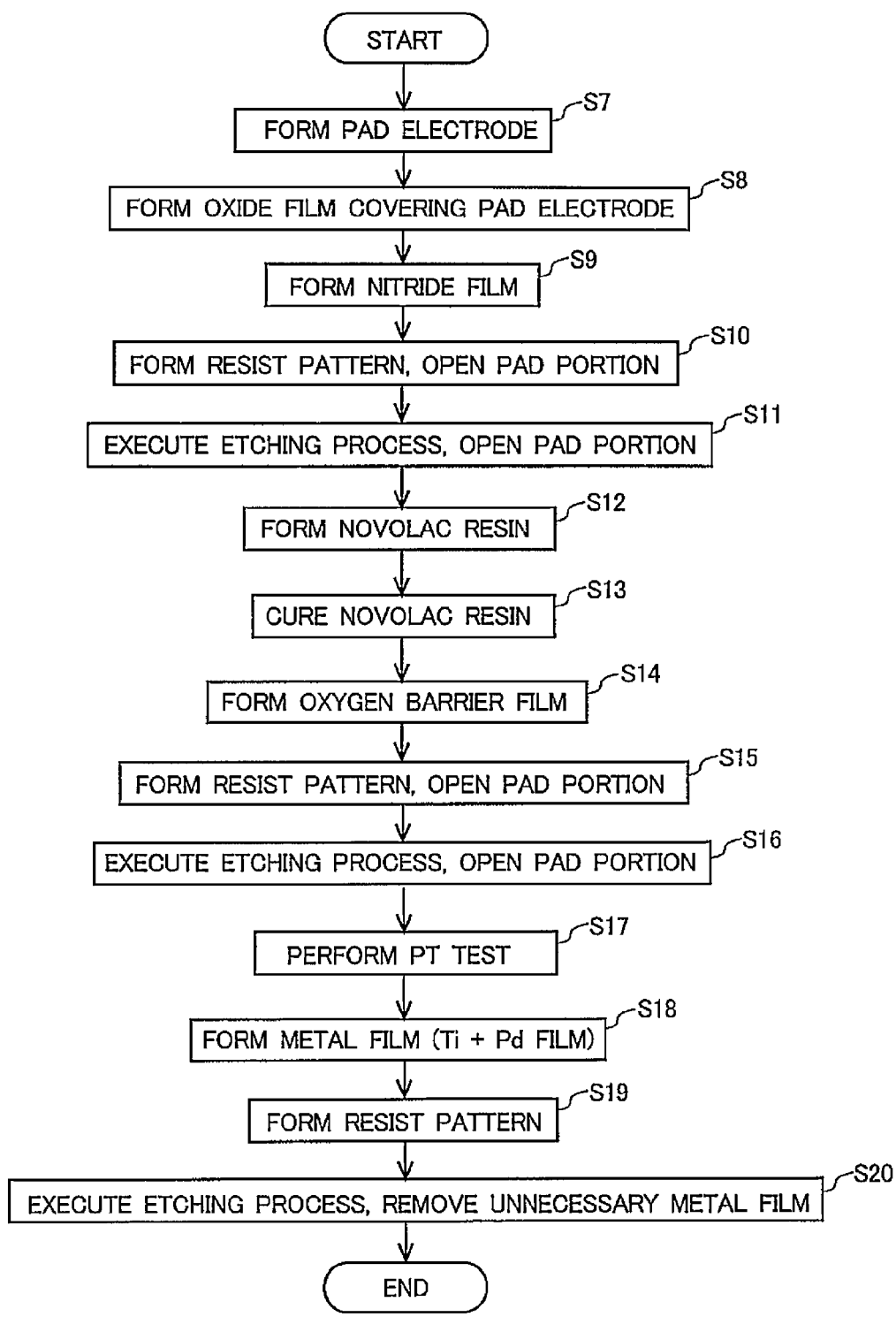
FIG. 20 is a view illustrating the ferroelectric memory and an outline of the manufacturing method thereof according to a third embodiment of the present disclosure.
Figure 21:
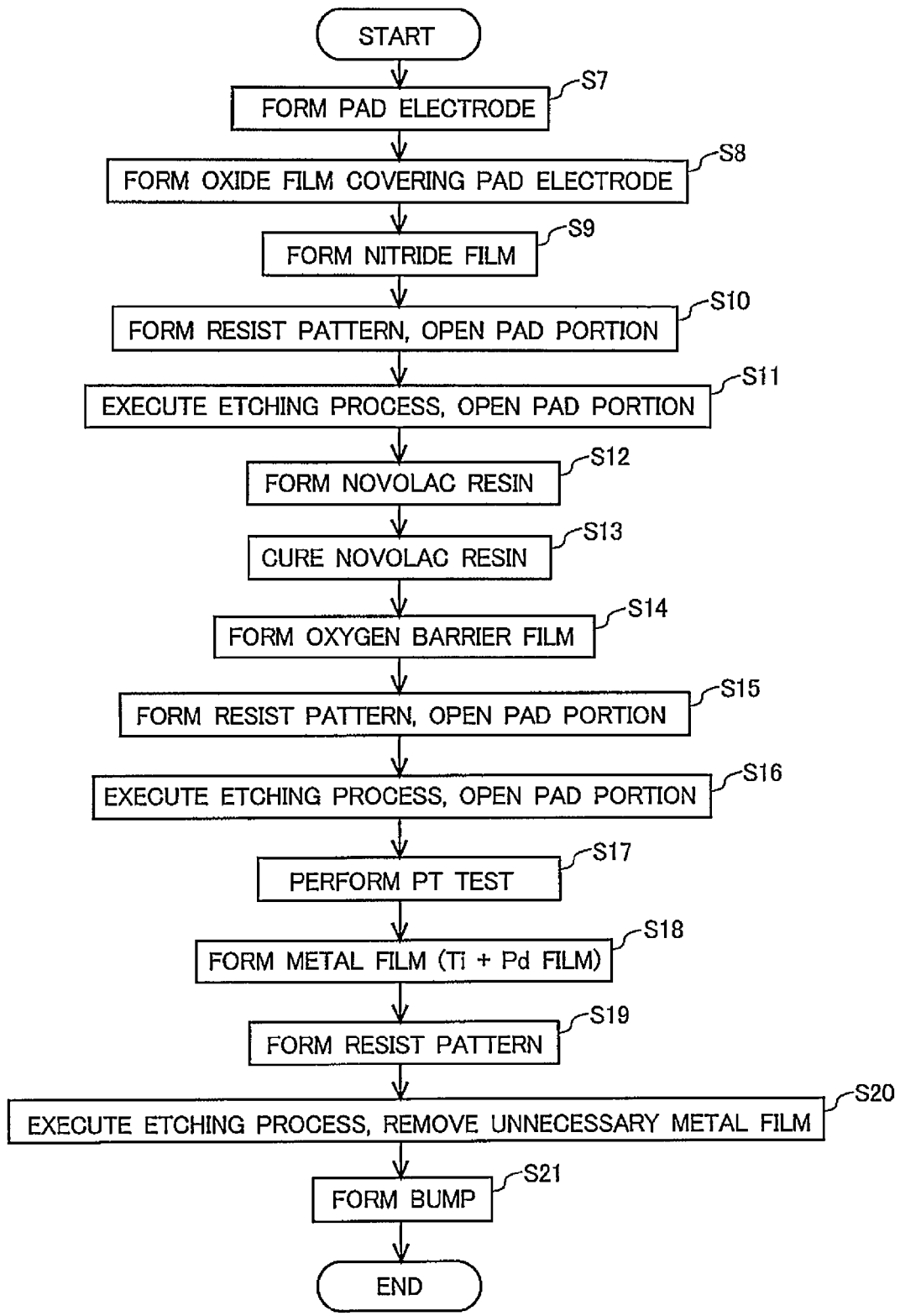
FIG. 21 is a view illustrating a process of forming the metal bump in the third embodiment of the present disclosure.

FIGS. 20 and 21 illustrate the FeRAM and an outline of the manufacturing process thereof according to a third embodiment. In the first embodiment discussed above, the cover film is formed from the novolac resin. Further, the second embodiment, the oxygen barrier film is formed further upwardly of the cover film based on the novolac resin. In the third embodiment, after the testing process through the pad electrode, a 2-layered metal film is formed. Other processes in the third embodiment are the same as those in the first embodiment and the second embodiment.

To be specific, in the third embodiment, the semiconductor substrate of the FeRAM with the passivation film formed with the aperture leading to the pad electrode, is subjected to a PT (Primary Test) test (S17), and further a metal film including a Ti film and a Pd film is formed on the pad electrode (S18). Then, the resist pattern covering the upper layer of the pad electrode is formed (S19), and the metal film excluding the upper layer of the pad electrode is etched (S20). FIG. 21 further illustrates a process of forming a metal bump (S21).

Through these processes, the probe is brought into contact with the pad electrode in the PT test, and, even if the pad electrode is damaged, the permeation of the hydrogen can be reduced. Namely, the Ti film enables adhesion of the Pd film and the metal bump to the pad electrode to be improved. Moreover, the Pd film has a hydrogen absorbing effect. If the pad electrode is damaged, the adhesion of the metal bump has a possibility of being deteriorated, however, the Ti film and the Pd film reduce the permeation of the hydrogen from the damaged portion.

Third Working Example

Figure 14:
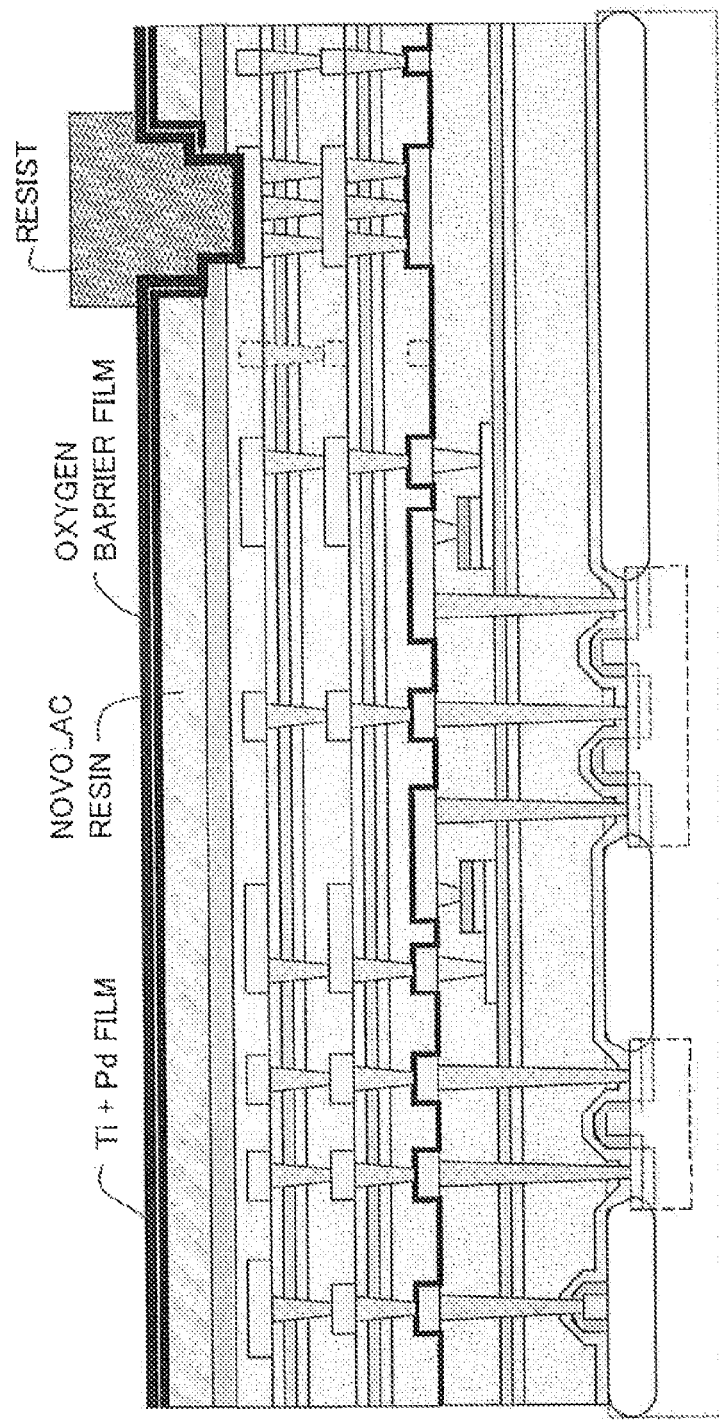
FIG. 14 is a view illustrating a process of forming a metal film after a PT test.

A third working example of the FeRAM and the manufacturing process according to the present disclosure will hereinafter be described with reference to FIGS. 14-16B. FIG. 14 depicts a metal film forming process after the PT test based on the pad electrode. In the PT test, the probe is brought into contact with the pad electrode, and hence the pad electrode might be damaged. This being the case, in the third embodiment, after the testing process, the Ti film as a first metal film is sputtered by, e.g., a sputtering method over the entire surface of the chip including the aperture portion of the pad electrode. Furthermore, the Pd film as a second metal film is sputtered. Thereafter, the resist pattern is formed. As in FIG. 14, the resist pattern covers only the PAD portion, the novolac resin opened in the PAD portion and an area vicinal to the aperture of the oxygen barrier film.

Figure 15B:
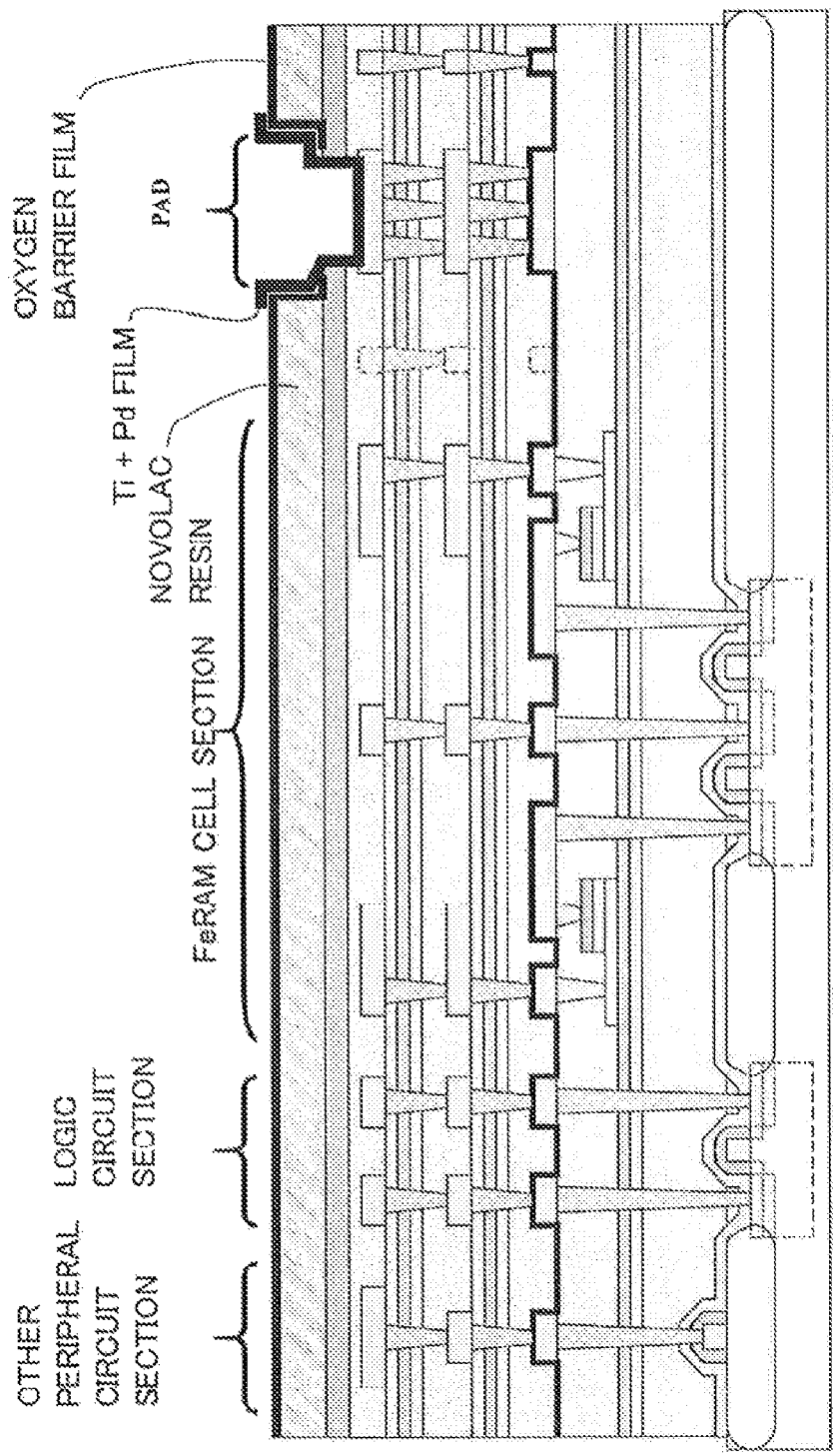
FIG. 15B is a plan view illustrating a shape of the metal fill after being etched.

FIGS. 15A and 15B illustrate a plan view and a sectional view after etching the metal film. Specifically, with the resist pattern serving as the mask, the Ti film and the Pd film are etched. On this occasion, the oxygen barrier film is etched as an etch stopper film. For this purpose, the oxygen barrier film is to be formed relatively thick beforehand. With this contrivance, the oxygen barrier film remains on the novolac resin even after being etched.

Figure 16A:
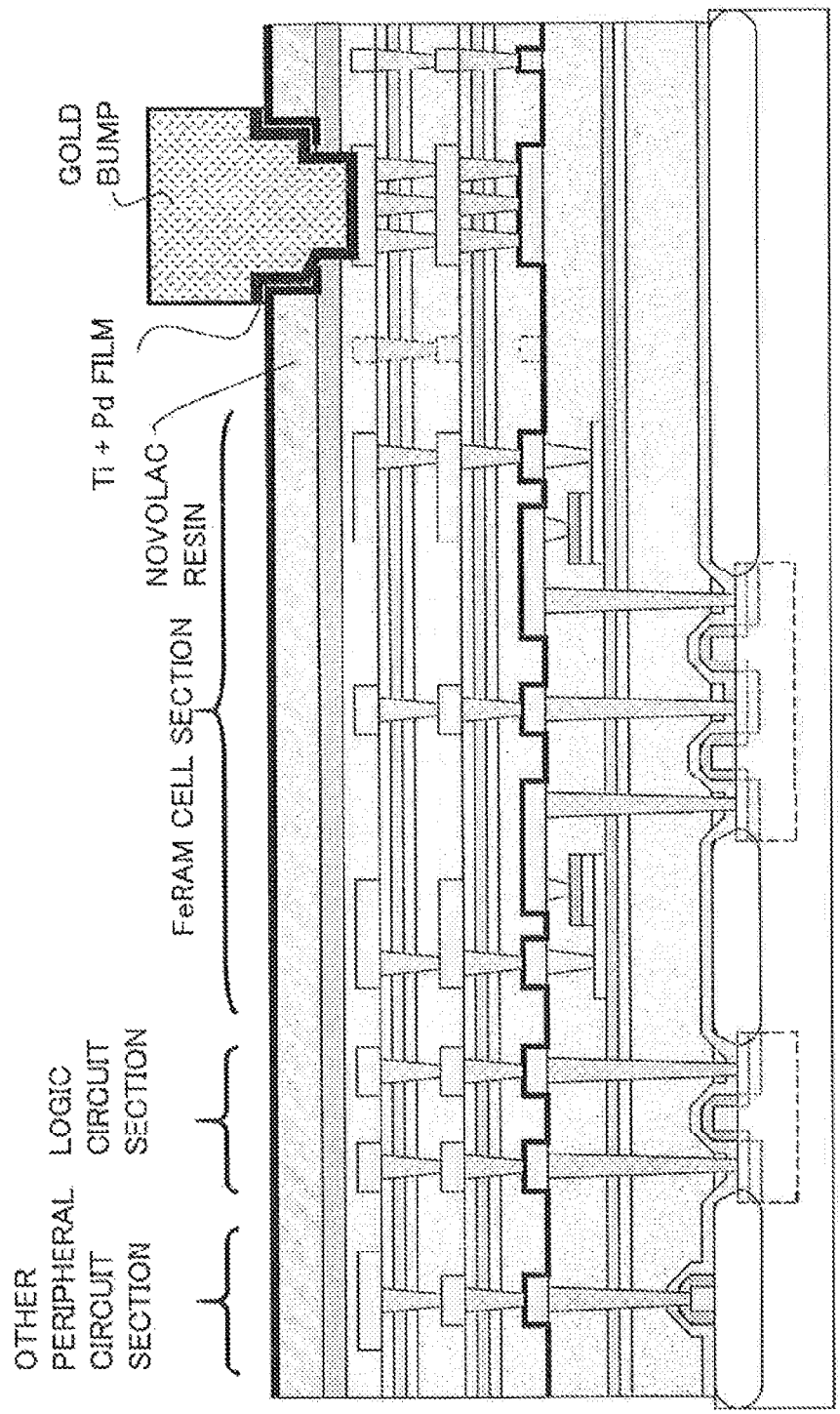
FIG. 16A is a view illustrating a process of forming a metal bump.

FIG. 16A depicts a metal bump forming process. A gold bump is formed on the pad electrode in a plating process. Note that the gold bump is herein illustrated, however, the bump may be composed of a noble metal other than gold.

The Pd film has a hydrogen absorbing characteristic, and hence, even if the pad electrode is damaged in the testing process, the permeation of the hydrogen from the damaged portion can be reduced. Further, the titanium (Ti) improves the adhesion of the metal to the pad electrode. Accordingly, the pad electrode is covered with the Ti film and the Pd film, whereby the hydrogen permeation preventive effect of the Pd film can be exhibited. Further, with this configuration, the Pd film and the metal bump are adhered to the pad electrode, thereby decreasing also the permeation of the water content.

Modified Example

Figure 16B:
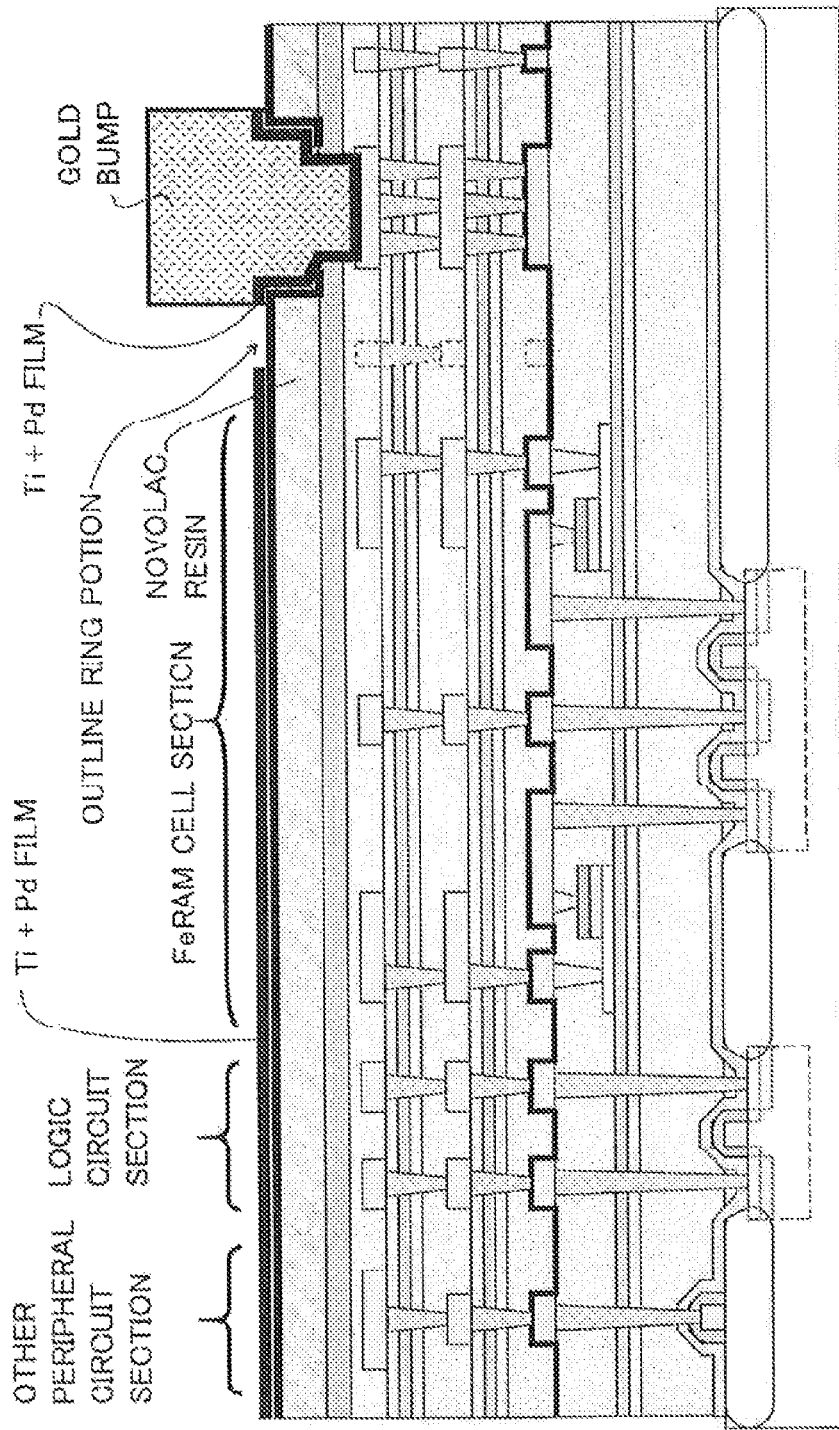
FIG. 16B is a view illustrating a process of forming a metal bump in a modified example.

FIG. 16B illustrates a modified example of the third embodiment. As in FIG. 16B, the Ti film and the Pd film may be formed in all of regions excluding an outline ring portion of the pad electrode. The "outline ring portion" connotes herein an edging region formed in the aperture region of each of the P-TEOS-NSG film and the P-SiN film on the pad electrode and having a predetermined width from the aperture portion of each of the novolac resin and the oxygen barrier film. The metal protective film is disposed over all of the regions excluding the outline ring portions.

In this case, a resist pattern cut out in a ring shape so as not to cover only the outline ring portion may be formed as the resist pattern for etching the Ti film and the Pd film. Namely, there may be formed the resist pattern which protects, from etching, the FeRAM cell portion and the logic circuit portion provided outside the pad electrode and the outline ring portion, and also protects other peripheral circuit portions, and the Ti film and the Pd film of the outline ring portion may be etched.

With this configuration, the Pd film, which has the hydrogen absorbing characteristic, can therefore reduce the permeation of the hydrogen from the chip surface and can ultimately reduce the permeation of the hydrogen into the ferroelectric capacitor within the chip. For example, even when the flat hydrogen/water content barrier film is provided between ferroelectric capacitor and the passivation film on the uppermost surface, a minute exfoliated fragment of the flat hydrogen/water content barrier film might exist. Further, the adhesion of the hydrogen/water content barrier film might deteriorate due to existence of minute dusts produced in the flattening process of the inter-layer insulating film etc on the basis of the CMP (Chemical Mechanical Polishing).

The nitride film immediately under the passivation film on the uppermost surface restrains the permeation of the water content but has a small effect in restraining the permeation of the hydrogen. Accordingly, if there is the minute exfoliated fragment of the hydrogen/water content barrier film provided within the substrate or if the adhesion gets deteriorated, with an elapse of the time, there is a possibility that the hydrogen gradually permeates the ferroelectric capacitor. Such being the case, the Ti film and the Pd film protect the uppermost layer of the substrate, thereby enabling the permeation of the hydrogen into the ferroelectric capacitor to be decreased owing to the hydrogen absorbing effect of the Pd film.

Moreover, in place of covering substantially the whole surface of the substrate excluding the outline ring portion with the metal film as described above, the limited portions, i.e., the aperture portion of the pad electrode, the region just above the ferroelectric capacitor and the periphery thereof may be covered with the metal film.

Fourth Embodiment

Figure 22:
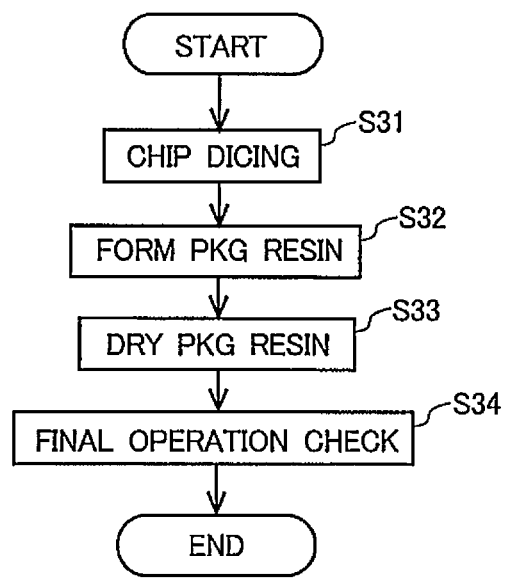
FIG. 22 is a view illustrating the ferroelectric memory manufacturing method according to a fourth embodiment of the present disclosure.

FIG. 22 illustrates the FeRAM manufacturing process according to a fourth embodiment. The fourth embodiment discusses the chip dicing and the packaging process. Hence, in FIG. 22, the pre-processes explained in the first embodiment are omitted through the third embodiment are omitted.

In this process, the semiconductor device formed on the semiconductor substrate is diced on the chip-by-chip basis (S31).

Next, the diced chips of the semiconductor device are provided with the package resins, thus executing the sealing process (S32). In the case of using the novolac resin as the passivation film, if the aging process is done in the air atmosphere, the novolac resin on the uppermost surface deteriorates. Especially when the temperature of the die for the package resin is equal to or high than 100° C., the influence caused by the oxygen is easy to occur. Such being the case, the package resin is formed while causing a flow of the nitrogen atmosphere or the argon atmosphere into the package die.

Next, the package resin is dried (S33). In this case, the novolac resin is not exposed directly to the air, and hence the novolac resin on the uppermost surface is not deteriorated. The drying temperature is, however, set equal to or lower than 280° C. With this contrivance, the thermally-caused deterioration of the novolac resin can be reduced.

As discussed above, according to the present disclosure, it is feasible to restrain the deterioration of the characteristic of the ferroelectric substance even by forming the excessive hydrogen/water content barrier film. Further, the passivation film can be formed by curing at the low temperature, so that the potential deterioration of the characteristic of the ferroelectric substance can be prevented, and the failure in the retention is ameliorated. Moreover, the novolac resin is used as the passivation film, whereby all of newly-arisen several problems can be overcome, and the long-term reliability of the ferroelectric capacitor can be improved.

Other Modified Examples

The first embodiment through the fourth embodiments have discussed the ferroelectric film as the PZT film. The ferroelectric film is not, however, limited to the PZT film, and an SBT ($SrBi_2Ta_2O_9$) film is also available. The ferroelectric film is, specifically, described such as a $PbZr_1$—$XTiXO_2$ film, a $Pb_1$—$XLaXZr_1$—$YTiYO_2$ film, or a $Bi_4Ti_2O_{12}$ film (where X and Y are real numbers).

The conventional technologies are incapable of reducing the influence of the heat evolved when performing the thermal treatment of the polyimide contained in the passivation film, and such a problem is not perfectly obviated that the characteristic of the ferroelectric capacitor becomes deteriorated. A degree of this deterioration is small as compared with the influence by the hydrogen and the water content. The thermal influence, however, adds to the characteristic of the ferroelectric substance, e.g., a problem that a hysteresis component (residual polarizing component) decreases.

Such being the case, a test for avoiding this problem is performed, in which a polyimide curing temperature is decreased down to, e.g., 230° C., however, an imidizing rate (bridging rate) of the polyimide is insufficient, resulting in a decline of reliability. Further, adhesion of a package resin to the polyimide decreases, and there is a case in which the film is peeled off at an interface between the polyimide and the package resin.

It is an object of the present disclosure to provide a technology of reducing thermally-caused deterioration of a storage characteristic and forming a passivation film exhibiting high reliability.

According to the present disclosure, in the semiconductor storage device, it is possible to decrease the thermally-caused deterioration of the storage characteristic and to form the passivation film exhibiting the high reliability.

The novolac resin can ensure sufficient reliability even when undergoing the thermal treatment at a lower temperature than that of a conventional passivation film. It is therefore feasible to restrain a characteristic of the ferroelectric capacitor from being deteriorated as well as to keep and ensure the reliability of the passivation film.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A manufacturing method of a semiconductor storage device, comprising:
    forming a transistor on a semiconductor substrate;
    forming a ferroelectric capacitor above said transistor;
    forming a wiring above said ferroelectric capacitor; and
    forming a first barrier film above said ferroelectric capacitor;
    forming a passivation film that includes a novolac resin on the first barrier film; and
    forming a second barrier film on said passivation film.

2. The manufacturing method of a semiconductor storage device according to claim 1, wherein said forming said passivation film, includes executing a thermal treatment in an inactive gas atmosphere at a curing temperature of 170° C. through 190° C. for 40 min.

3. The manufacturing method of a semiconductor storage device according to claim 2, wherein the inactive gas is a nitrogen gas or an argon gas.

4. The manufacturing method of a semiconductor storage device according to claim 1, wherein said wiring includes a pad electrode; and
    further comprising forming a metal protective film on said pad electrode.

5. The manufacturing method of a semiconductor storage device according to claim 1, wherein:
    said first barrier film includes silicon nitride; and
    said second barrier film includes aluminum oxide or titanium oxide.

* * * * *

UNITED STATES PATENT AND TRADEMARK OFFICE
CERTIFICATE OF CORRECTION

| | | |
|---|---|---|
| PATENT NO. | : 8,921,125 B2 | Page 1 of 1 |
| APPLICATION NO. | : 13/442217 | |
| DATED | : December 30, 2014 | |
| INVENTOR(S) | : Kouichi Nagai | |

It is certified that error appears in the above-identified patent and that said Letters Patent is hereby corrected as shown below:

On the title page item (54), and in the specification, Col. 1, Line 1-3,

Change

"METHOD OF MAKING FERROELECTRIC MEMORY DEVICE WITH BARRIER LAYER AND NOVOLAC RESIN PASSIVATION LAYER"

To Be

--METHOD OF MAKING A FERROELECTRIC MEMORY DEVICE WITH BARRIER LAYER AND NOVOLAC RESIN PASSIVATION LAYER--

Signed and Sealed this
Nineteenth Day of May, 2015

Michelle K. Lee
*Director of the United States Patent and Trademark Office*